United States Patent [19]

Mori et al.

[11] Patent Number: 5,311,465
[45] Date of Patent: May 10, 1994

[54] SEMICONDUCTOR MEMORY DEVICE THAT USES A NEGATIVE DIFFERENTIAL RESISTANCE

[75] Inventors: Toshihiko Mori; Naoki Yokoyama, both of Kawasaki, Japan

[73] Assignee: Fujitsu Limited, Kawasaki, Japan

[21] Appl. No.: 20,839

[22] Filed: Feb. 22, 1993

[30] Foreign Application Priority Data

Feb. 21, 1992 [JP] Japan .................................. 4-035311

[51] Int. Cl.$^5$ .............................................. G11C 11/40
[52] U.S. Cl. .................................. 365/179; 365/189.01; 365/174
[58] Field of Search ............ 365/182, 189.01, 189.05, 365/179, 174

[56] References Cited

U.S. PATENT DOCUMENTS 5,216,630  1/1993  Nakase .................................. 365/179

Primary Examiner—Terrell W. Fears
Attorney, Agent, or Firm—Staas & Halsey

[57] ABSTRACT

A semiconductor memory device comprises a memory cell transistor that includes two active parts each including therein an emitter and a base and showing a negative differential resistance. The collector layer is shared commonly by the two active parts and is connected to a bit line, while the emitters forming the two active parts are connected to respective word lines that form a word line pair. The bit line and the word lines forming the word line pair are biased to realize a bistable operational state in the memory cell transistor to hold the information.

11 Claims, 30 Drawing Sheets

FIG. 2
PRIOR ART
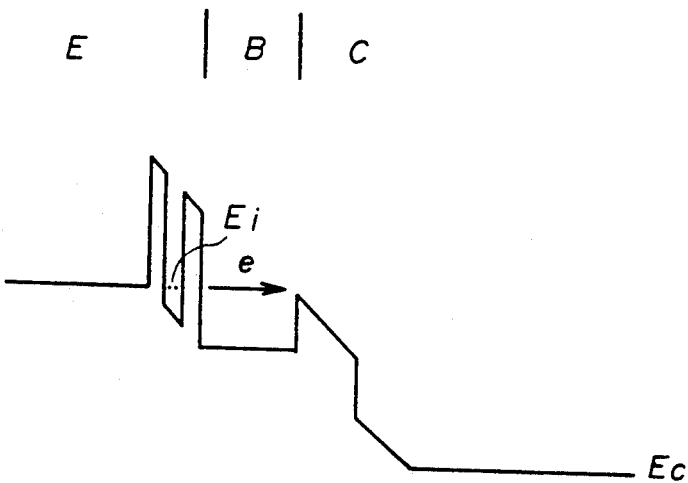
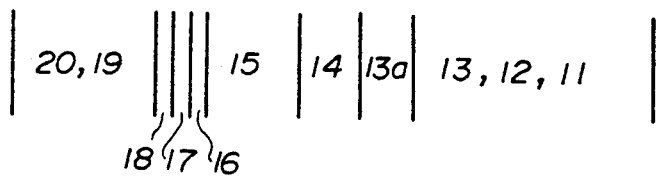
FIG. 3
PRIOR ART
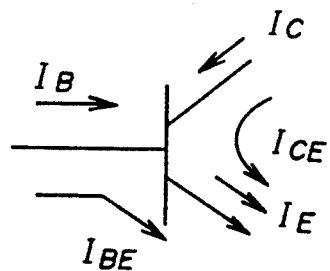
$V_{CE} = V_{CB} + V_{BE}$

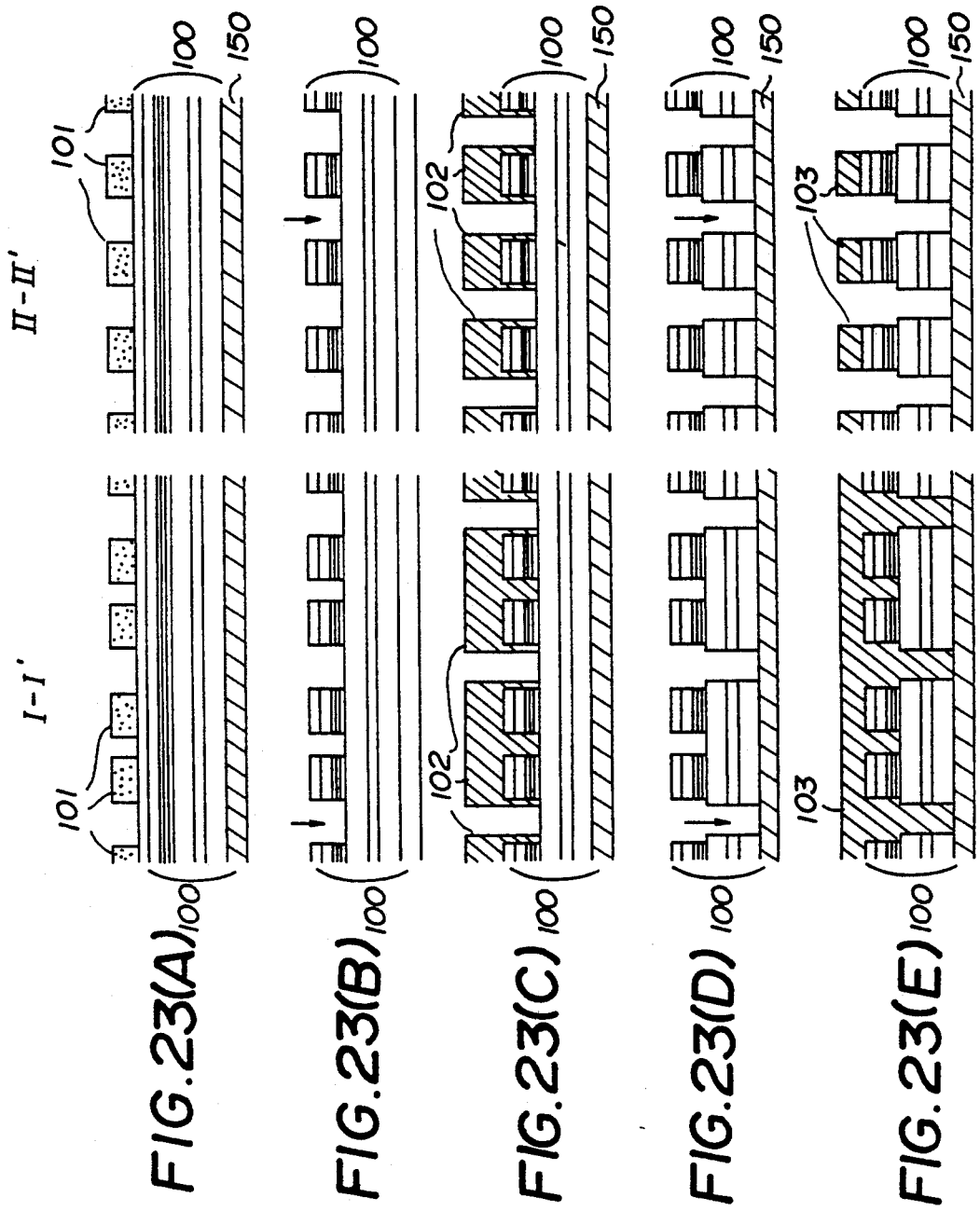

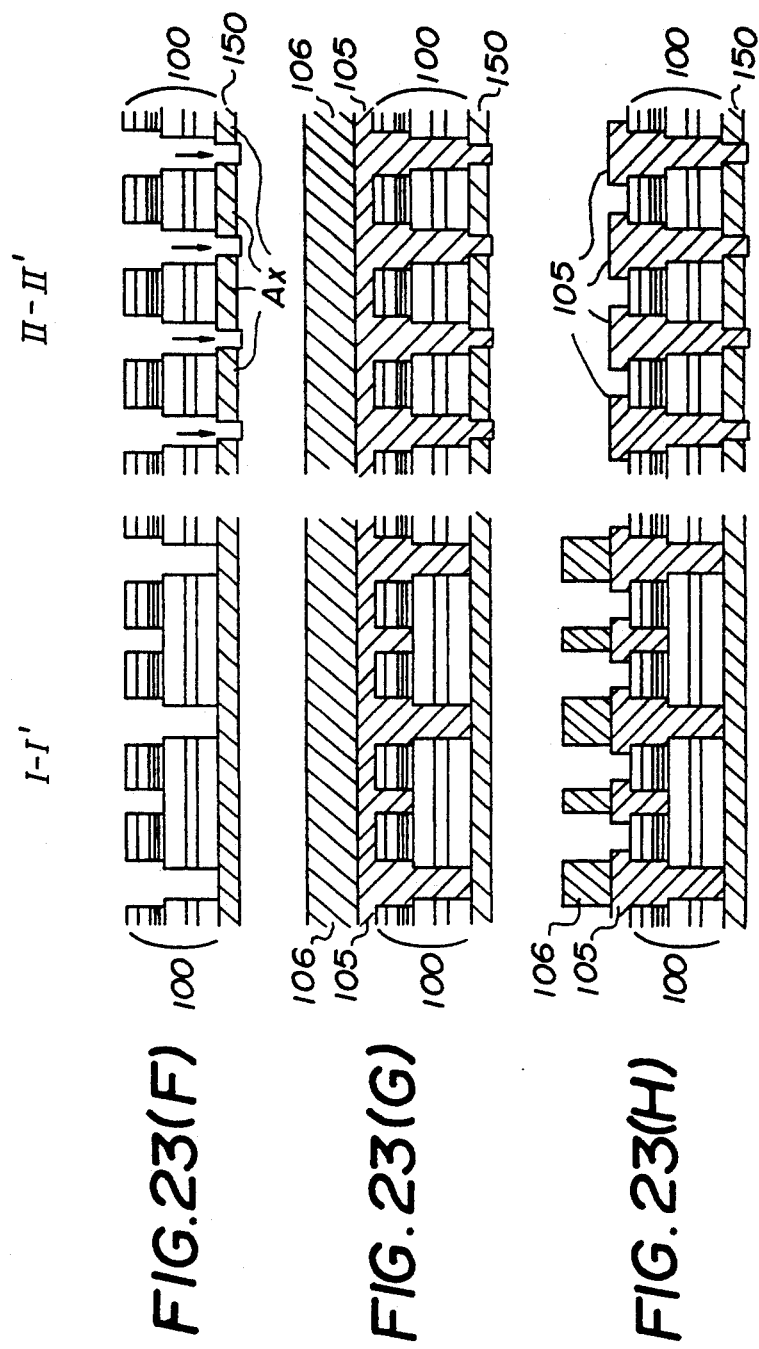

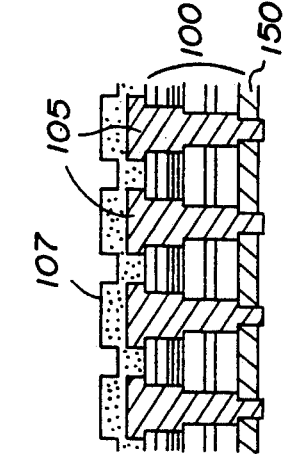
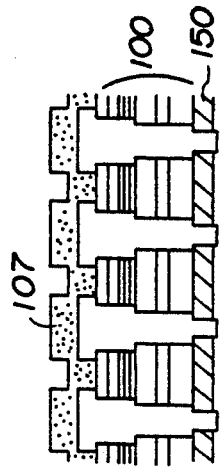
FIG.23(I)
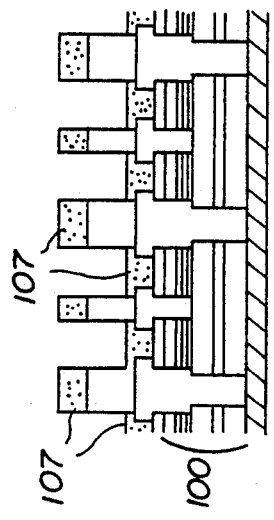
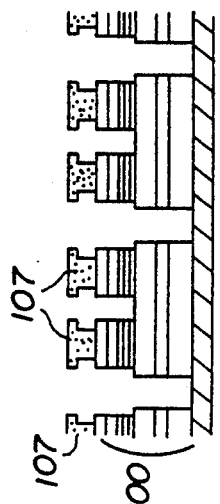
FIG.23(J)

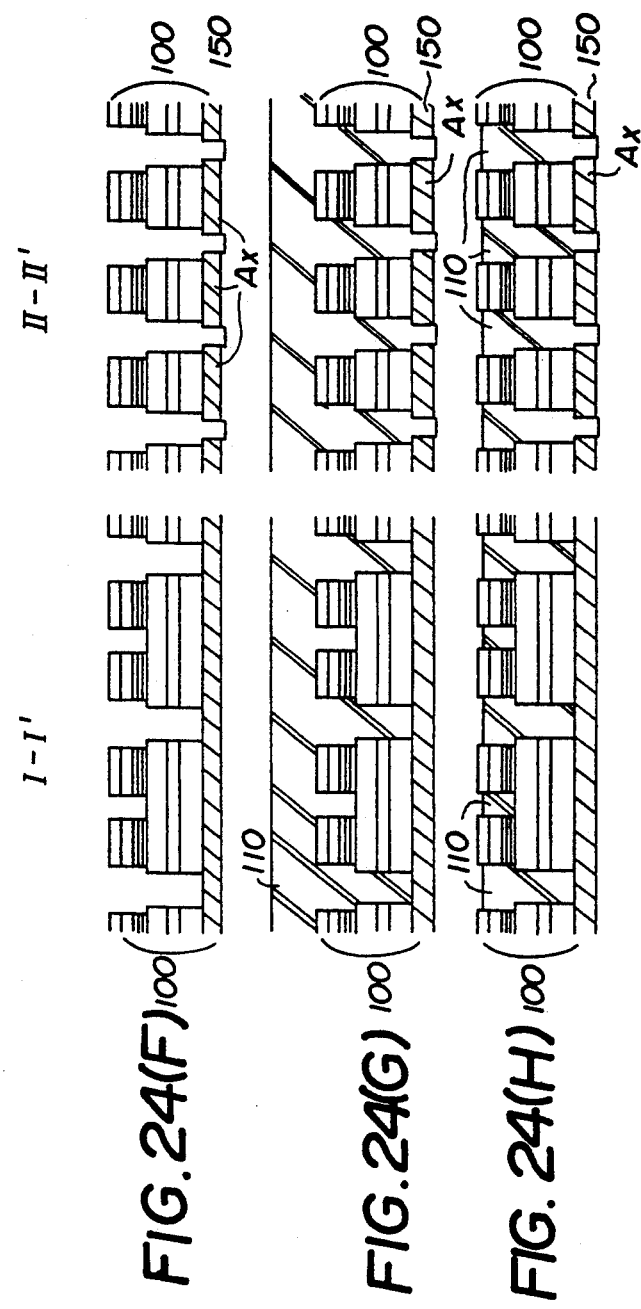

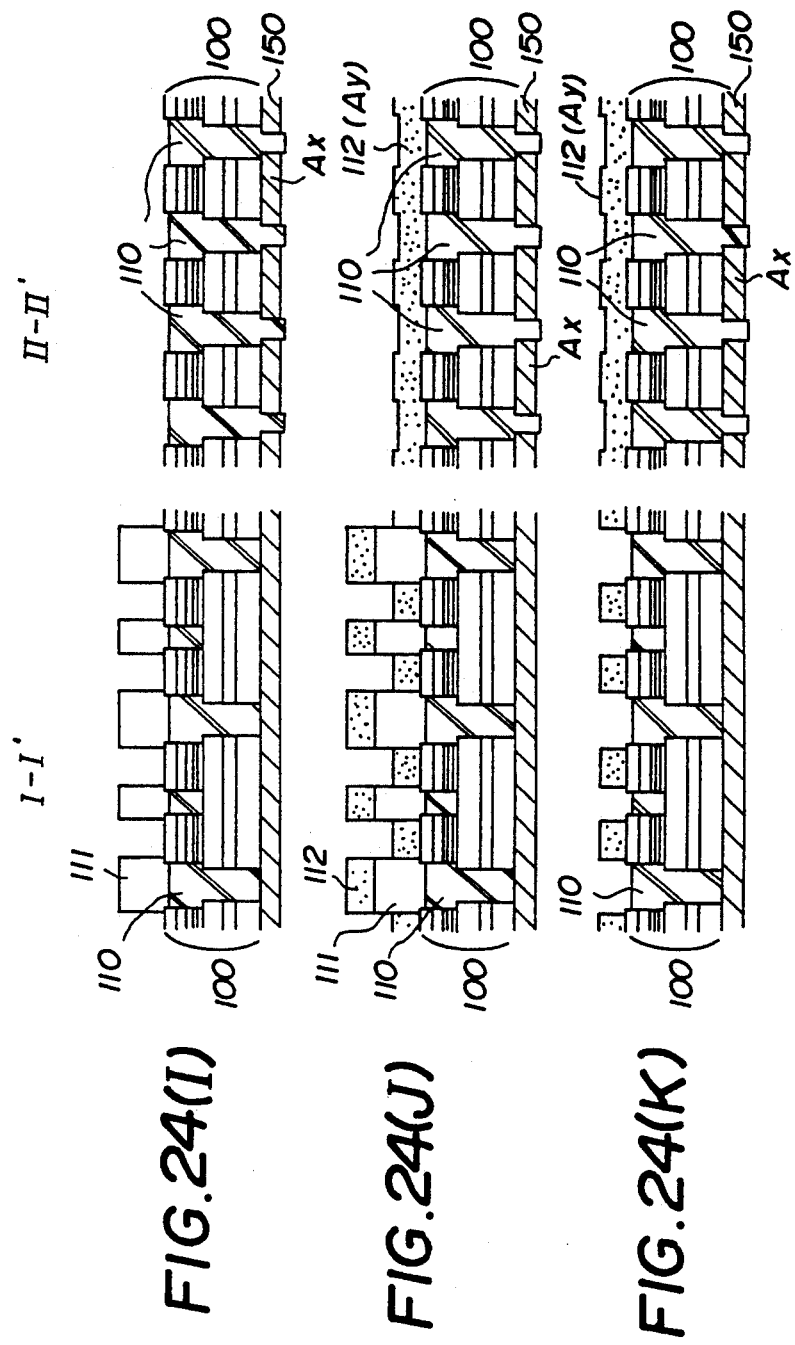

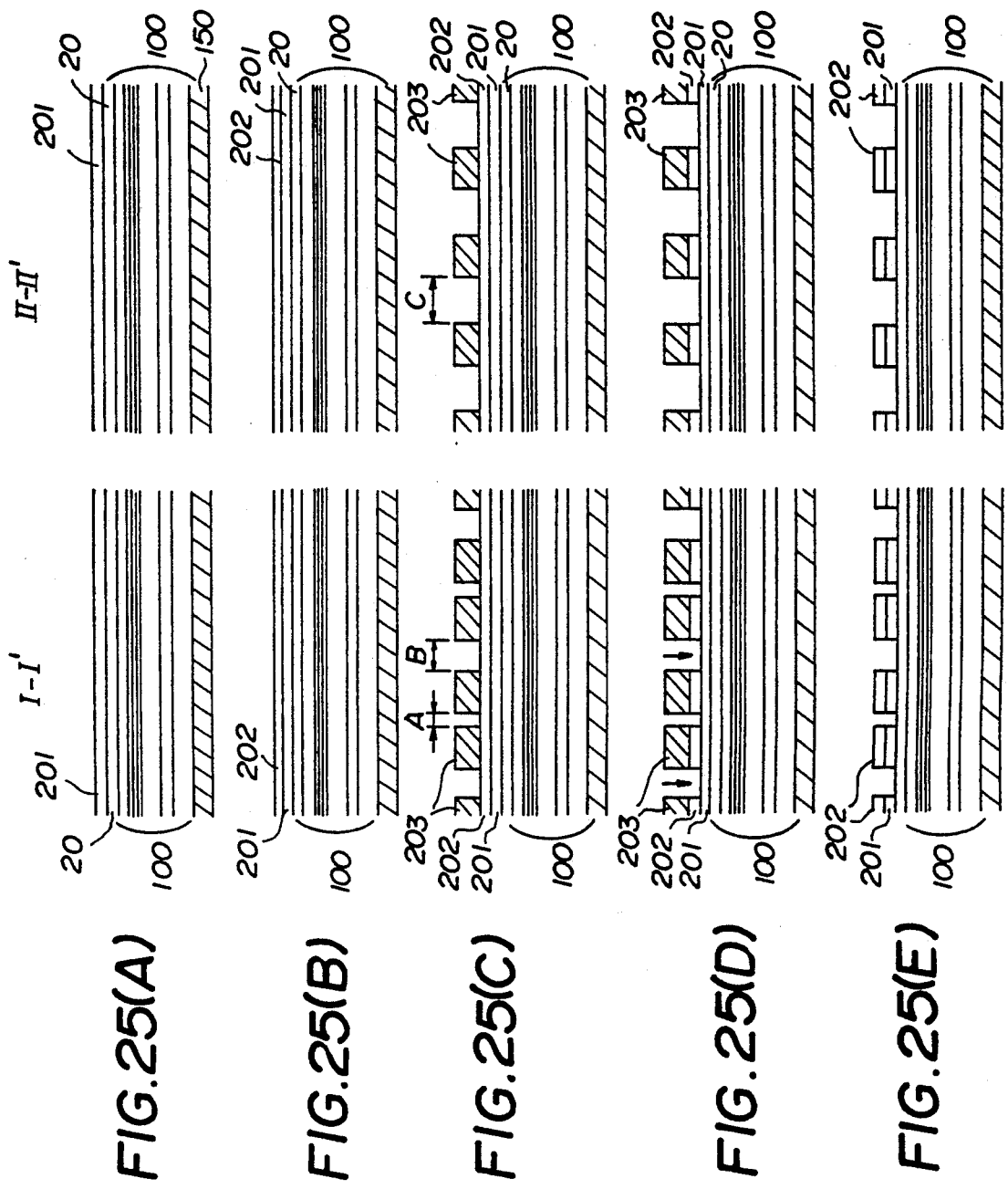

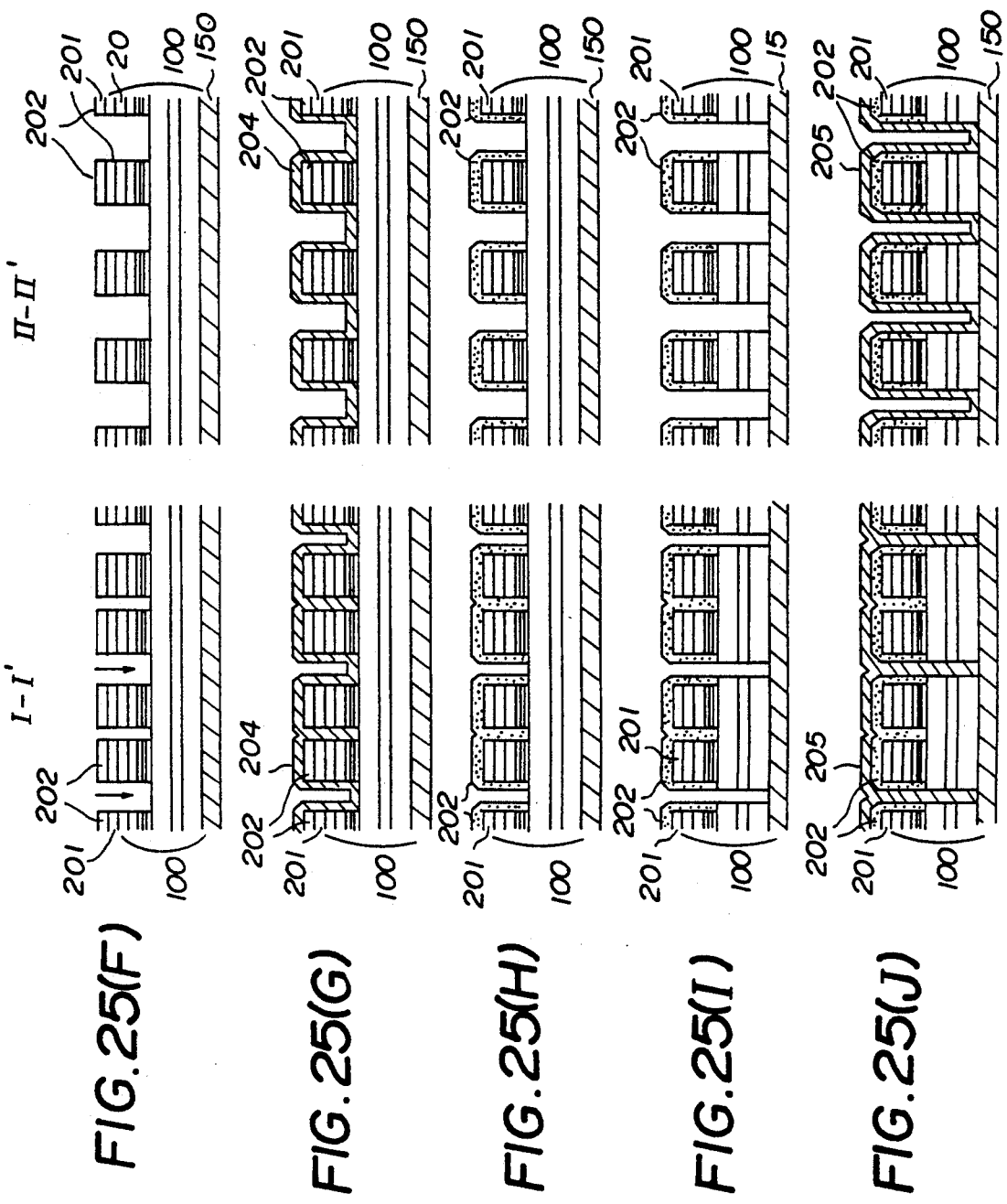

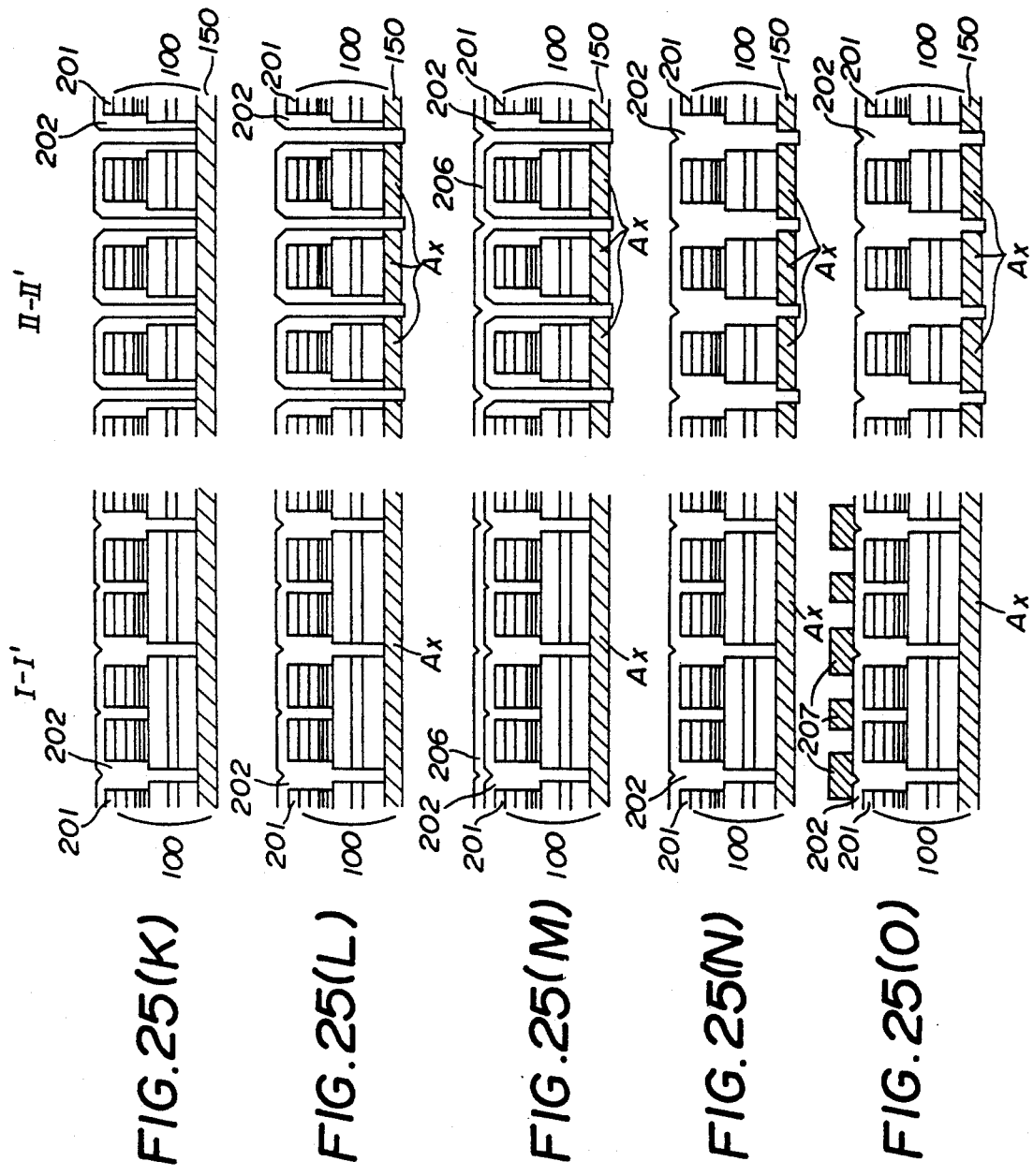

SEMICONDUCTOR MEMORY DEVICE THAT USES A NEGATIVE DIFFERENTIAL RESISTANCE

BACKGROUND OF THE INVENTION

The present invention generally relates to semiconductor devices, and more particularly to a memory cell that uses a negative differential resistance of RHET and a memory device that uses such a memory cell.

Semiconductor memories are used extensively as essential element of computers and other microprocessors. In order to increase the storage capacity, various efforts have been made for increasing the integration density of the semiconductor memory devices. Generally, a dynamic random access memory (DRAM), a typical example of the semiconductor memory device, uses a FET for storing information. Although the dynamic random access memory can be constructed to have an extremely small size, the necessity of periodical refreshment for retaining the information substantially deteriorates the access speed of the device.

On the other hand, there is a so-called static random access memory (SRAM) that stores information as a result of the flip-flop operation of transistors. This type of memory device does not require refreshing and hence provides a very fast access speed. Thus, the device is used extensively for cache memories that require a particularly high access speed. On the other hand, conventional static random access memory devices use at least six transistors to obtain the desired flip-flop action. Thus, the device inevitably occupies a substantial area and the desired increase in the integration density cannot be achieved easily.

SUMMARY OF THE INVENTION

Accordingly, it is a general object of the present invention to provide a novel and useful semiconductor memory device wherein the foregoing problems are eliminated.

Another and more specific object of the present invention is to provide a semiconductor memory device that does not require refreshing and can be fabricated to occupy a minimum area of a substrate on which the semiconductor memory device is to be constructed.

Another object of the present invention is to provide a semiconductor memory device that uses the differential negative resistance of an RHET constructed to exhibit a bistable operation.

Another object of the present invention is to provide a semiconductor memory device, comprising:

a first conductor strip extending in a first direction as a bit line, said first conductor strip having an upper major surface;

a second conductor strip extending in a second direction different from said first direction as a first word line, said second conductor strip having a lower major surface and provided above said first conductor strip with a separation therefrom;

a third conductor strip extending also in said second direction and located adjacent to said second conductor strip as a second word line, said third conductor strip having a lower major surface and provided above said first conductor strip with a separation therefrom; and a transistor provided in correspondence to a first intersection wherein said first conductor strip and said second conductor strip cross with each other when viewed in a direction perpendicular to said upper major surface of said first conductor strip and further in correspondence to a second intersection wherein said first conductor strip and said third conductor strip cross with each other when viewed in a direction perpendicular to said upper major surface of said first conductor strip;

said transistor showing a negative differential resistance and comprising:

a collector layer provided on said upper major surface of said first conductor strip to extend continuously along said first conductor strip from said first intersection to said second intersection, said collector layer comprising: a doped semiconductor layer for collecting carriers; and a collector barrier layer provided on said doped semiconductor layer for forming a potential barrier in said collector layer;

a base layer of a doped semiconductor material provided on an upper major surface of said collector layer to extend continuously from said first intersection to said second intersection, said base layer causing a transit of carriers therethrough;

a first emitter layer provided on said first base layer in correspondence to said first intersection such that said first emitter layer has an upper major surface in contact with said lower major surface of said second conductor strip, said first emitter layer comprising: a first resonant structure including a quantum well layer sandwiched by a pair of tunneling barrier layers for realizing said negative differential resistance and a doped semiconductor layer provided on said first resonant structure for injecting carriers into said base layer via said first resonant structure; and a second emitter layer provided on said second base layer in correspondence to said second intersection such that said second emitter layer has an upper major surface in contact with said lower major surface of said third conductor strip, said second emitter layer comprising: a second resonant structure including a quantum well layer sandwiched by a pair of tunneling barrier layers for realizing said negative differential resistance and a doped semiconductor material provided on said second resonant structure for injecting carriers into said base layer via said second resonant structure.

According to the present invention, one can realize a negative differential resistance in the transistor between the collector layer and the first emitter layer and further between the collector layer and the second emitter layer as a result of the quantum level formed in the first and second emitter layers. Further, by supplying first and second, mutually different emitter voltages to the first and second emitter layers via the first and second word lines with a suitable offset voltage therebetween, it is possible to realize a bistable operational state in the transistor as a result of the combination of the two negative differential resistance characteristics that are pertinent to the first emitter layer and the second emitter layer. Thereby, storage of binary information is achieved by setting the transistor in either of the first and second bistable states. As the memory device of the present invention is formed in correspondence to the first and second intersections as set forth above, the area of the substrate that is occupied by the memory device is minimum. This in turn enables increase of the integration density to a maximum degree, without being restrained from the device structure contrary to the case of conventional SRAMs or DRAMs. As the device of the present invention can be constructed based upon the compound semiconductor materials which exhibit an extremely large carrier mobility, one can simultaneously maximize both the access speed and the integration density of the device.

Another object of the present invention is to provide a memory cell transistor having a collector, a base provided on said collector, a first emitter provided on said base, and a second emitter provided on said base commonly to said first emitter with an electrical separation therefrom, said memory cell transistor injecting carriers from said first and second emitters into said collector via said base and showing a negative differential resistance between said collector and said first emitter and between said collector and said second emitter, a bit line connected to said collector for carrying a bit line selection signal;

a first word line connected to said first emitter for carrying a first word line selection signal;

a second word line connected to said second emitter for carrying a second word line selection signal;

bit line selection means for supplying said bit line selection signal; and word line selection means for supplying said first and second word line selection signals such that said first word line selection signal is biased to a voltage level that is higher than said second word line selection signal.

According to the present invention, the semiconductor memory cell transistor thus configured shows a bistable operational characteristic characterized by two bistable states and stores binary information by assuming either of these two bistable states. The content of information stored in the memory cell transistor can be read out by changing the bit line voltage with respect to the word line voltages while prohibiting current amplification by the memory cell transistor. Thereby, the content of the information is read by detecting the current flowing through the bit line. Further, the writing of information is achieved by causing to operate the memory cell transistor in one of the two operational points selectively.

Other objects and further features of the present invention will become apparent from the following detailed description when read in conjunction with the attached drawings.

BRIEF DESCRIPTION OF THE DRAWINGS

FIG. 2 is a band diagram of the RHET in a biased state;

FIG. 3 is a circuit diagram showing the equivalent circuit of the RHET;

FIGS. 23(A)-23(J) are diagrams showing the fabrication process of an SRAM according to another embodiment the present invention;

FIGS. 24(A)-24(K) are diagrams showing the fabrication process of an SRAM according to another embodiment; and FIGS. 25(A)-25(R) are diagrams showing the fabrication process according to another embodiment of the present invention.

DETAILED DESCRIPTION OF THE PREFERRED EMBODIMENTS

Figure 1:
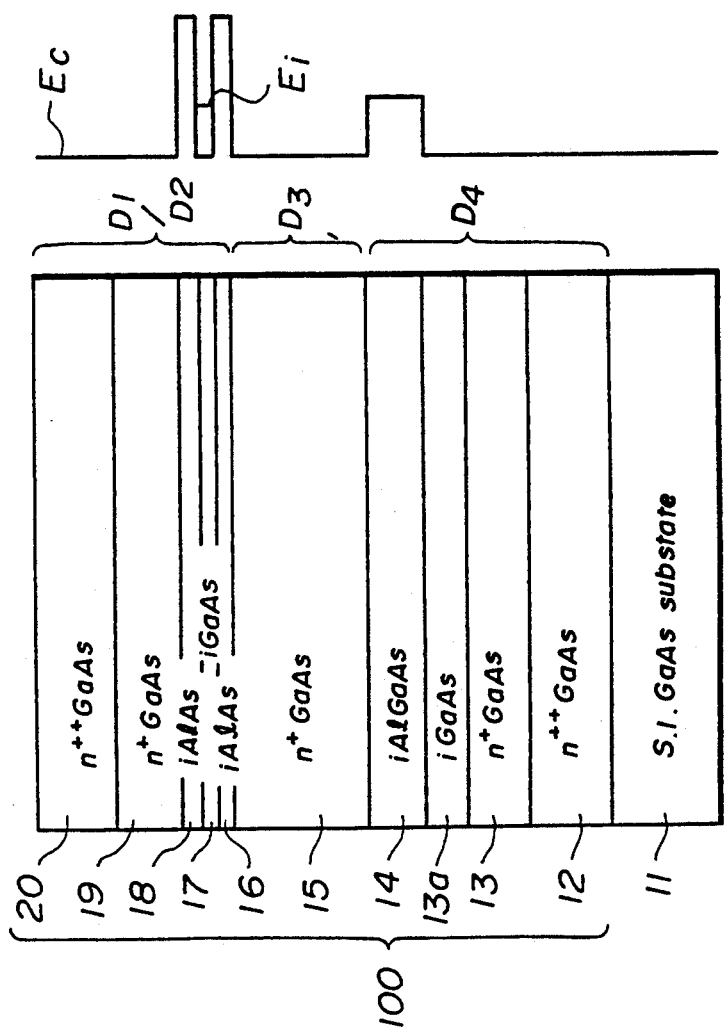
FIG. 1 is a diagram showing the structure of an RHET and the band diagram thereof.

FIG. 1 shows the structure of a conventional resonant-tunneling hot electron transistor (RHET) together with the band diagram thereof.

Referring to FIG. 1, the RHET has a layered body 100 formed on a semi-insulating GaAs substrate 11, wherein the layered body 100 includes an $n^{++}$-type GaAs layer 12 grown on the substrate 11 epitaxially, an $n^+$-type GaAs layer 13 grown epitaxially on the layer 12, an undoped GaAs layer 13a grown epitaxially on the layer 13, a barrier layer 14 of undoped AlGaAs grown epitaxially on the layer 13a, and an $n^+$-type GaAs layer 15 grown epitaxially on the layer 14. On the layer 15, a thin barrier layer 16 of undoped AlAs is grown epitaxially and an undoped GaAs layer 17 is grown further on the layer 16. Further, an undoped layer 18 of AlAs is grown epitaxially on the layer 17 such that the GaAs layer is sandwiched by the AlAs layers 16 and 18. On the layer 18 thus grown, an $n^+$-type GaAs layer 19 is grown epitaxially, and an $n^{++}$-type GaAs layer 20 is grown on the layer 19 epitaxially.

In such a structure, the layers 16 and 18 of AlAs having a large band gap forms a potential barrier as represented in the band diagram of FIG. 1, and a quantum level $E_i$ is formed in the GaAs layer 17 as a result of the carrier confinement by the barrier layers 16 and 18. Further, there is formed another potential barrier which corresponds to the layer 14 and has an increased band gap. Thereby, the layers 16–20 act as an emitter layer the layer 15 acts as a base layer, and the layers 12–14 act as a collector layer.

FIG. 2 shows the band diagram of the RHET of FIG. 1 in the biased state.

Referring to FIG. 2, a bias voltage is applied across the emitter layer E and collector layer C such that the quantum level $E_1$ in the layer 17 coincides with the lower edge of the conduction band Ec of the doped GaAs layers 19 and 20. Thereby, the electrons are injected to the base layer B by tunneling through the barrier layers 16 and 18 as well as the intervening quantum well layer 17. The electrons thus injected retain energy and transit through the base layer B as hot electrons. By setting the biasing level appropriately with respect to the base layer B and the collector layer C, it is possible to cause the hot electrons injected from the emitter layer E to enter into the collector layer C by overriding the potential barrier formed in the collector layer C by the barrier layer 14.

FIG. 3 shows the equivalent circuit diagram of the RHET of FIG. 1. In FIG. 3, it will be noted that various parameters are defined including a base current $I_B$, wherein the base current $I_B$ represents the current caused by the electrons that have been injected from the emitter layer E and failed to transit to the collector layer C. From FIG. 3, it will be noted that the collector-emitter voltage $V_{CE}$ is given as a sum of the collector-base voltage $V_{CB}$ and the base-emitter voltage $V_{BE}$. In other words, there holds a relationship $$V_{CE} = V_{CB} + V_{BE}.$$

Figure 4A:
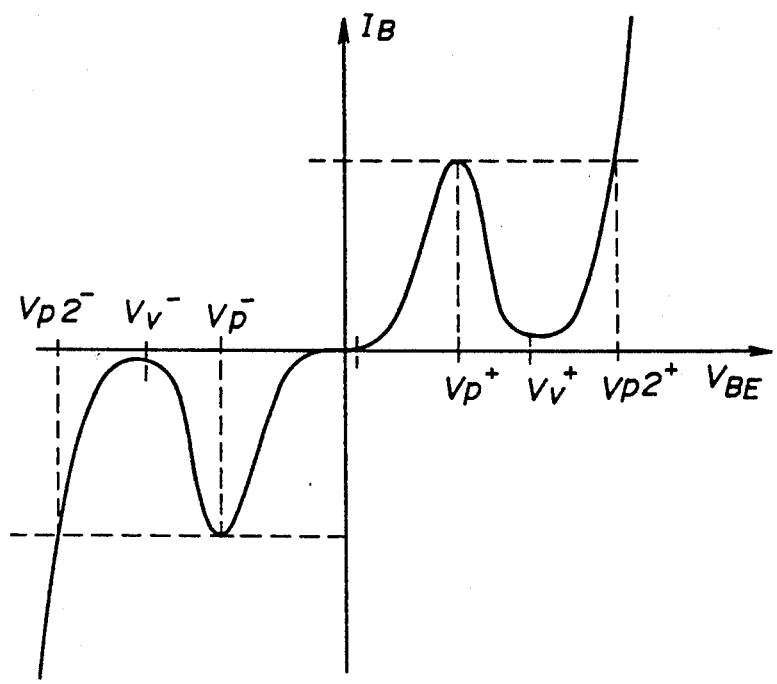
FIGS. 4(A) and 4(B) are diagrams showing the operational characteristics of the RHET for various biasing states.
Figure 4B:
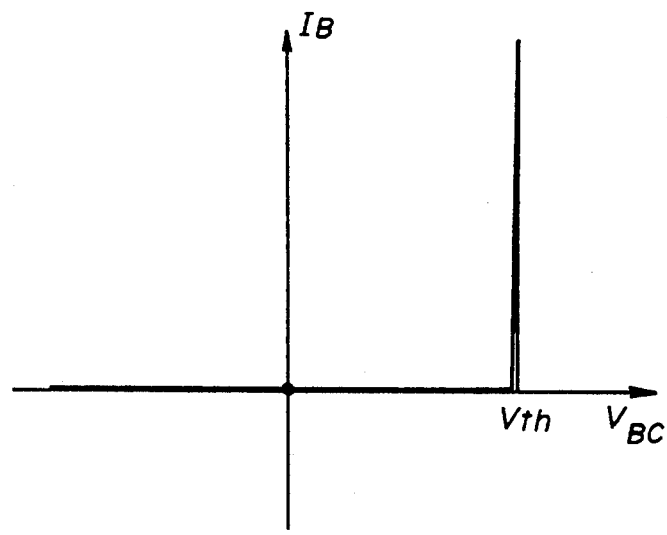

FIGS. 4(A) and 4(B) show the characteristics of the RHET of FIG. 1, wherein FIG. 4(A) shows the base current $I_B$ as a function of the base-emitter voltage $V_{BE}$ while FIG. 4(B) shows the base current $I_B$ as a function of the base-corrector bias voltage $V_{BC}$ Referring to FIG. 4(A), it will be noted that the base current increases steeply in correspondence to a voltage $V_p^+$ or $V_p^-$ that in turn corresponds to the resonance of the quantum level $E_i$ with respect to the lower edge of the conduction band Ec of the emitter layer E. More specifically, the injection of the electrons into the base layer B increases significantly in the resonant state. FIG. 4(B) in turn indicates the effect of the potential barrier of the layer 14. It will be noted that no substantial base current $I_B$ flows until a threshold voltage $V_{th}$ corresponding to the barrier height of the layer 14 is reached. Once the voltage $V_{th}$ is reached, the base current $I_B$ increases steeply.

Figure 5A:
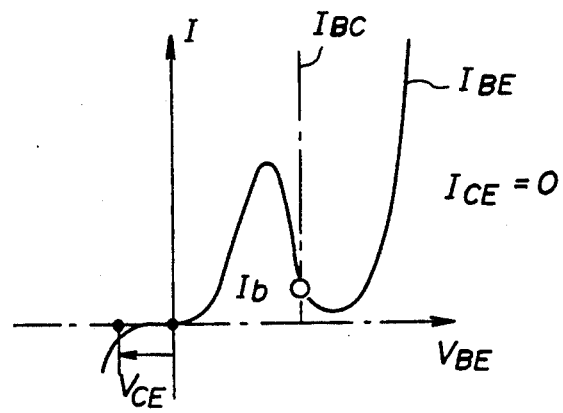
FIGS. 5(A) and 5(B) are other diagrams showing the operational characteristics of the RHET.

FIG. 5(A) shows the operational condition of the RHET wherein no substantial gain appears. Referring to FIG. 5(A), the transistor is biased across the collector and the emitter by a bias voltage $V_{CE}$ that is set small enough so that the carriers injected from the emitter layer E and passing through the base layer B are substantially blocked by the barrier layer 14. The bias condition is represented as $$V_{CE} < V_r.$$

wherein $V_r$ represents a threshold level with respect to the collector-emitter voltage and is related to the height of the potential barrier formed by the layer 14. Under the foregoing condition, no substantial collector-emitter current $I_{CE}$ flows ($I_{CE}=0$) and the base current $I_B$ coincides to the base-emitter current $I_{BE}$ ($I_B=I_{BE}$). Thereby, the operational point of the device is represented by an intersection of the curve $I_{BE}$ and the curve $I_{BC}$ as marked by a circle.

Figure 5B:
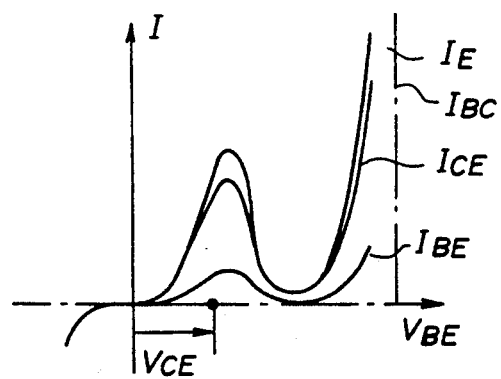

When the bias voltage $V_{CE}$ is increased beyond the foregoing threshold level $V_r$, on the other hand, the collector current starts to flow and the emitter current $I_E$ is now represented as a sum of the collector-emitter current $I_{CE}$ and the base-emitter current $I_{BE}$, as represented in FIG. 5(B). Thereby, it will be noted that an amplification of the current $I_B$ occurs as usual in the bipolar transistors.

Figure 6A:
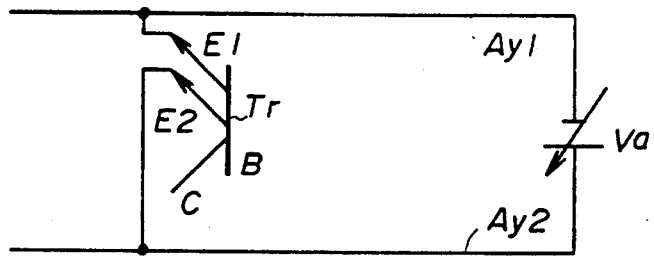
FIGS. 6(A)-6(C) are diagrams showing the principle of the memory cell transistor that uses an RHET.

Next, the principle of the memory cell transistor of the present invention will be described with reference to FIGS. 6(A)–6(C), wherein FIG. 6(A) shows a circuit diagram of an RHET Tr that has two emitters, $E_1$ and $E_2$.

Referring to the circuit diagram of FIG. 6(A), 10 the first emitter $E_1$ of the RHET is connected to a line $Ay_1$ while the second emitter $E_2$ is connected to a line $Ay_2$. On the other hand, the base B and the collector C are open and no voltage is applied externally. Further, the lines $Ay_1$ and $Ay_2$ are biased by a d.c. voltage source Va such that the line $Ay_1$ is biased negatively while the line $Ay_2$ is biased positively.

Figure 6B:
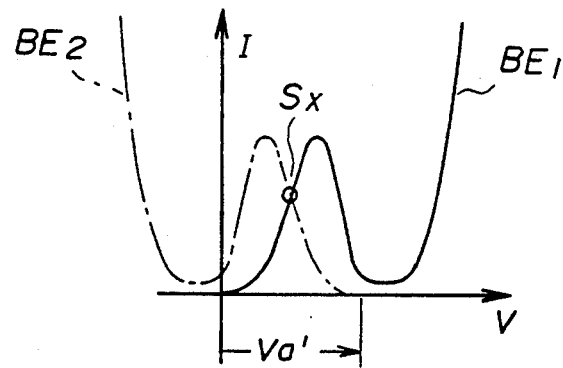

FIG. 6(B) shows the operational state of the transistor Tr under a small bias condition wherein a small bias voltage Va is applied across the lines $Ay_1$ and $Ay_2$. There, it will be noted that the curve representing the base-emitter current $I_{B \rightarrow E_1}$ that flows through the emitter $E_1$ and the curve representing the base-emitter current $I_{E_2 \rightarrow B}$ that flows through the emitter $E_2$ in the opposite direction are separated from each other to form a single, stable operational point $S_x$ at an intersection between the curves $BE_1$ and $BE_2$. When the bias voltage Va is increased as shown in FIG. 6(C), on the other hand, it will be noted that the separation between the curve $BE_1$ and the curve $BE_2$ decreases and there appear two stable operational points $S_1$ and $S_2$ separated from each other by an unstable operational point $S_n$. In other words, there is realized a bistable state in the circuit of FIG. 6(A) by adjusting the bias voltage Va appropriately.

Figure 7:
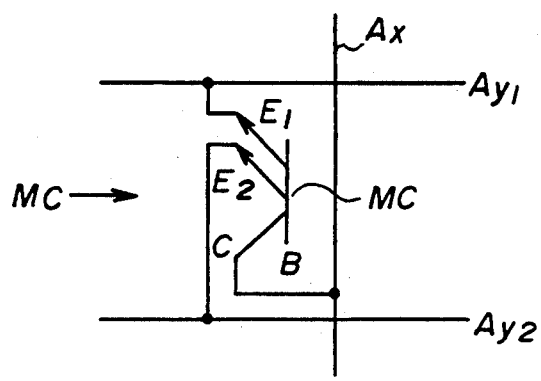
FIG. 7 is a circuit diagram showing the equivalent circuit of the memory cell transistor according to a first embodiment of the present invention.

FIG. 7 shows the equivalent circuit diagram of a memory cell transistor MC according to a first embodiment of the present invention. It should be noted that the memory cell transistor MC corresponds to the RHET Tr of FIG. 6(A). Thus, the same notation will be used in FIG. 7 for the base, emitter and collector of the transistor MC as used in the RHET of FIG. 6(A).

Referring to FIG. 7, the circuit of FIG. 7 is similar to the circuit of FIG. 6(A) except that the collector C is connected to a line Ax acting as a bit line, while the lines $Ay_1$ and $Ay_2$ are used as word lines. There, the reading and writing of information can be achieved by addressing a memory cell transistor that in turn is achieved by selecting a bit line Ax and a pair of word lines $Ay_1$ and $Ay_2$. When writing information, the state of the transistor is switched between the two bistable states, while the reading of information is achieved by detecting the collector current flowing through the bit line Ax as will be described in detail later.

Figure 8:
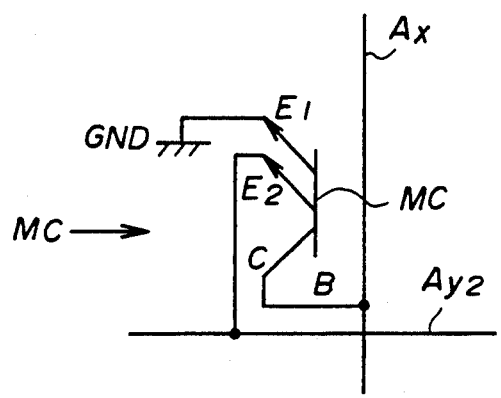
FIG. 8 is a circuit diagram showing the equivalent circuit of the memory cell transistor according to a second embodiment of the present invention.

FIG. 8 shows a second embodiment of the present invention wherein the first emitter $E_1$ is grounded. Thus, the memory cell transistor MC of FIG. 8 uses only one word line $Ay_2$ that is connected to the second emitter $E_2$. Otherwise, the construction of the device of FIG. 8 is substantially identical with the device of FIG. 7.

Figure 9:
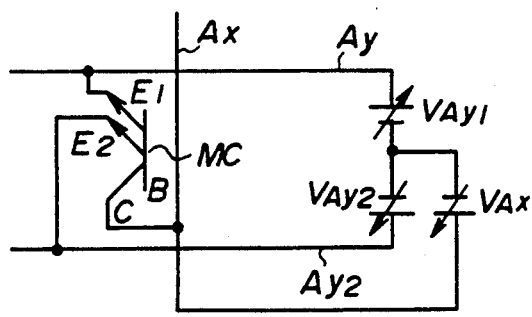
FIG. 9 is a diagram showing the principle of the memory cell transistor according to the first embodiment.

FIG. 9 and FIGS. 10(A)–10(E) are diagrams showing the operational principle of the memory cell transistor of FIG. 7 in detail, wherein FIG. 9 includes various voltages $V_{Ax}$, $V_{Ay1}$ and $V_{Ay2}$ that are applied to the bit line Ax, the first word line $Ay_1$ and the second word line $Ay_2$ respectively. It will be noted that the voltage $V_{Ax}$ represents the bit line voltage while the voltages $V_{Ay1}$ and $V_{Ay2}$ represent the word line voltages.

Figure 6C:
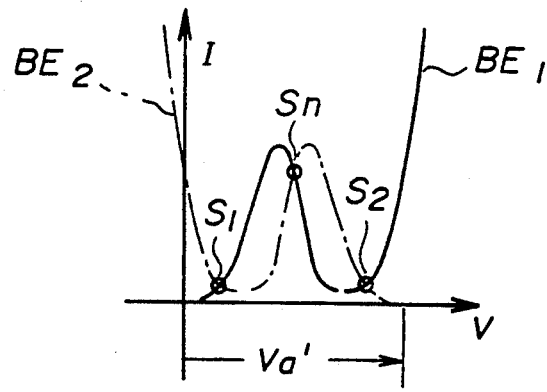
Figure 10A:
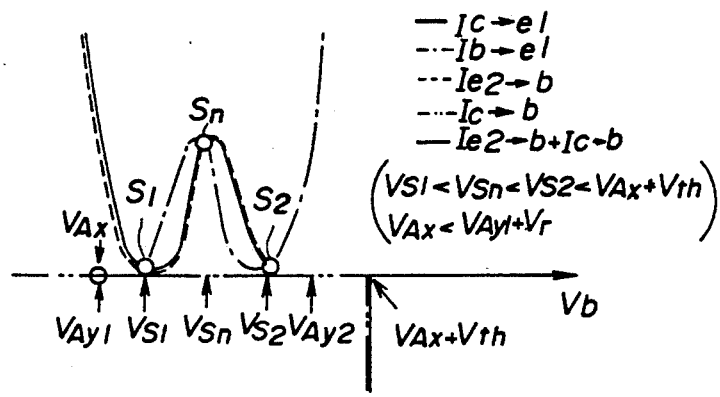
FIGS. 10(A)-10(E) are diagrams showing the operation of the memory cell transistor of FIG. 9.

FIG. 10(A) shows the stationary state of the memory cell transistor MC for holding data, wherein it will be noted that the state of FIG. 10(A) is substantially identical with the state of FIG. 6(C). There, the transistor MC is operated under the region that produces no substantial gain, and in correspondence to this, the bit line voltage $V_{Ax}$ is set smaller than the word line voltage $V_{Ay1}$ by the threshold voltage Vr ($V_{Ax} < V_{Ay1} + Vr$). It should be noted that the quantity $V_{Ax} - V_{Ay1}$ corresponds to the collector-emitter voltage $V_{CE}$ and the foregoing condition corresponds to the previously mentioned bias condition $V_{CE} < Vr$. In addition to the foregoing condition, the voltage $V_{Ax}$ is set to satisfy the condition $$V_{S1} < V_{Sn} < V_{S2} < V_{AX} + V_{th}$$

wherein $V_{S1}$ represents the voltage of the operational point $S_1$, $V_{Sn}$ represents the voltage of the unstable operational point $S_n$, and $V_{S2}$ represents the voltage of the operational point $S_2$. Further, $V_{th}$ represents the threshold of the base-collector junction shown in FIG. 4(B). In the state of FIG. 10(A), it should be noted that only a very small emitter current flows through the emitter $E_1$ and the emitter $E_2$, and the memory cell transistor consumes little electric power in the stationary state.

Figure 10B:
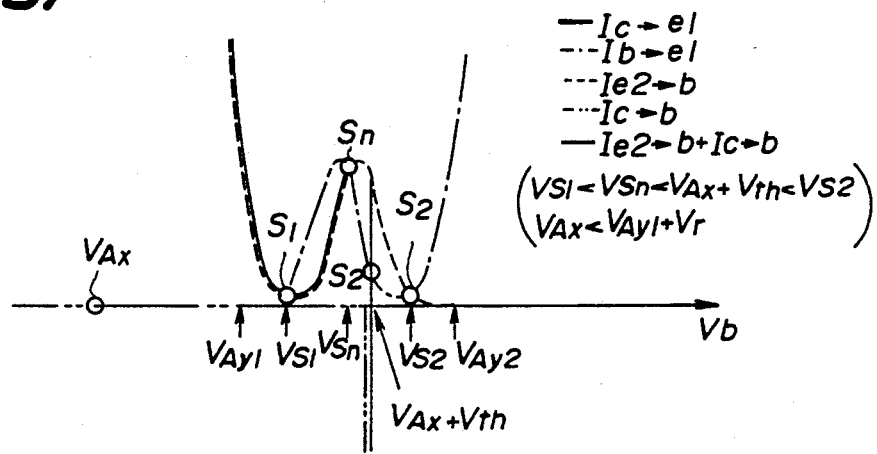

FIG. 10(B) shows the reading of data from the memory cell transistor MC for the case wherein the data is written in the form of the stable state $S_2$.

Referring to FIG. 10(B), the bit line voltage $V_{Ax}$ is set to satisfy the condition $$V_{Ax} < V_{Ay1} + Vr$$

and further that a condition $$V_{S1} < V_{Sn} < V_{Ay} + V_{th} < V_{S2}$$

is met. Thereby, the operational point $S_2$ originally at the voltage $V_{s2}$ now shifts to the voltage $V_{Ax} + V_{th}$ that corresponds to an intersection point $S_2'$ between the collector-emitter current $I_{E2 \to B} + I_{C \to B}$ represented by a thick continuous line and the base-emitter current $I_{B \to E1}$ corresponding to the base-emitter current flowing through the emitter $E_1$ and represented by a one-dotted chain in the drawing. It should be noted that under the bias condition of $V_{Ax} < V_{Ay1} + Vr$, the transistor MC operates with no substantial gain. Here, the current $I_{E2 \to B}$ represents the current flowing to the base B from the emitter $E_2$ while the current $I_{C \to B}$ represents the current flowing from the collector C to the base B. At the operational point $S_2'$, the condition of current conservation, $I_{E2 \to B} + T_{C \to} = I_{B \to E1}$ is satisfied. Thereby, it will be noted that an emitter current corresponding to the operational point $S_2'$ flows through the bit line Ax.

It should be noted that the memory cell transistor MC is in the stable state $S_2$ when the foregoing biasing is applied as already noted. When the memory cell transistor MC is in the stable state $S_1$, on the other hand, the operational point $S_1$ does not move substantially even when the bit line voltage $V_{Ax}$ and the word line voltages $V_{Ay1}$ and $V_{Ay2}$ are biased as described above. Thereby, no substantial current flows through the bit line Ax. Thus, by applying the bias voltages as noted above to the bit line and the word lines, one can read out the content of information that is stored in the memory cell transistor MC.

Next, the writing of information into the memory cell transistor MC will be described, wherein the case for writing information in correspondence to the state $S_1$ and the case for writing information in correspondence to the state $S_2$ will be described separately.

Figure 10C:
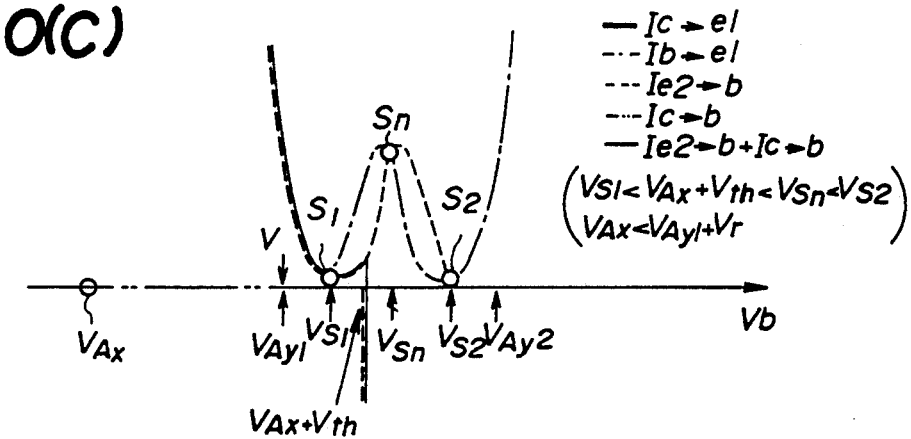

FIG. 10(C) shows the case for writing the first binary data in the form of the stable operational point $S_1$.

Referring to the drawing, the memory cell transistor MC is biased to the gain-free state by setting the bit line voltage $V_{Ax}$ and the word line voltage $V_{Ay1}$ to satisfy the relationship $$V_{Ax} < V_{Ay1} + Vr,$$

similarly to the previous embodiments. In addition, the voltage $V_{Ax}$ is set to satisfy a relationship $$V_{S1} < V_{Ax} + V_{th} < V_{Sn} < V_{S2}$$

such that the memory cell transistor MC operates only at the operational point $S_1$. Thereby, it should be noted that the continuous line representing the current $I_{E2 \to B} + I_{C \to B}$ and the base-emitter current $I_{b \to E1}$ represented by the one-dotted chain cross each other at the point $S_1$. On the other hand, the operational point $S_2$ disappears.

Figure 10D:
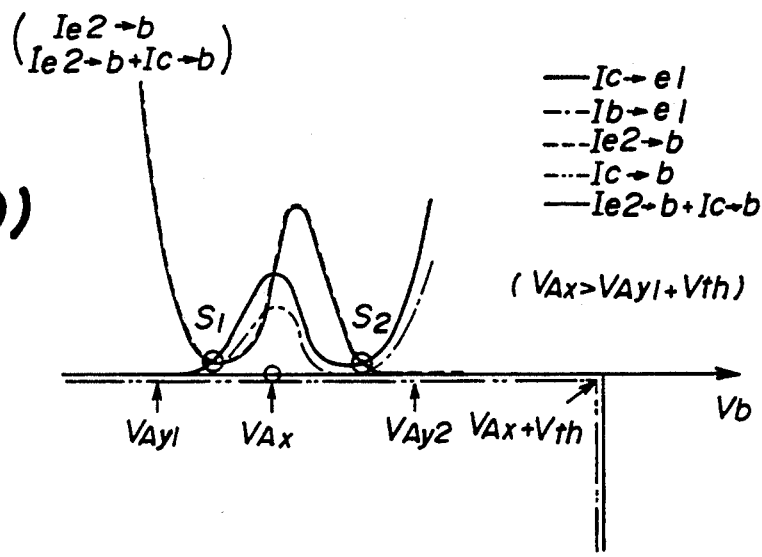

When writing the second, different binary data into the memory cell transistor MC in the form of the operational point S2, on the other hand, the memory cell transistor MC is operated in the gain region by setting the bit line voltage $V_{Ax}$ to satisfy a relationship $V_{Ax} > V_{Ay1} + V_{th}$. Thereby, the transistor MC operates as shown in FIG. 10(D), wherein FIG. 10(D) shows the state in which the two operational points $S_1$ and $S_2$ still exist. With further increase in the voltage $V_{AX}$, and the gain the stable operational point $S_1$ disappears, as represented in FIG. 10(E), and only one stable operational point $S_2$ remains.

Figure 10E:
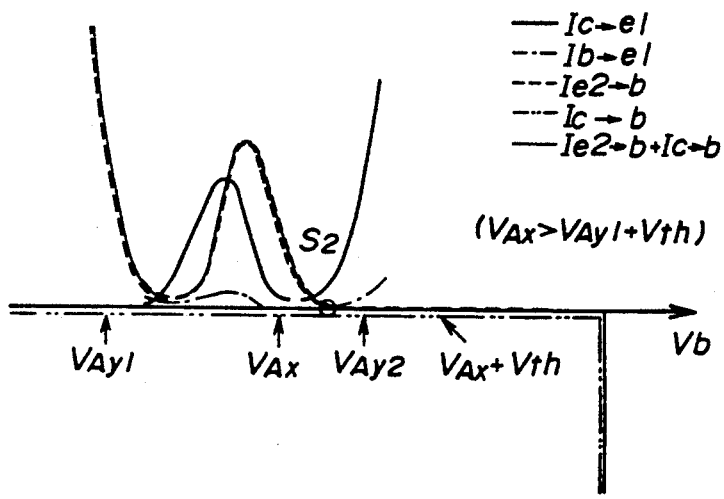

In FIG. 10(E), it should be noted that the current $I_{B \to E1}$, represented by the one-dotted chain, becomes substantially smaller than the current $I_{C \to E1}$, represented by the thick continuous line, and the current $I_{B=E1}$ does not cross any of the thin continuous line representing the current $I_{E2 \to B} + I_{C \to B}$ or the broken line representing the current $I_{E2 \to B}$ in correspondence to the operational point $S_1$. It should be noted that the collector-base current $I_{C \to B}$ is substantially zero in the operational condition of FIGS. 10(D) and 10(E), and hence the operational point is given as the intersection of the current $I_{B \to E1}$ and the current $I_{E2 \to B}$. Thereby, the memory cell transistor MC is forced to operate at the operational point $S_2$ wherein the current flows from the emitter $E_2$ to the collector $E_1$.

Figure 11A:
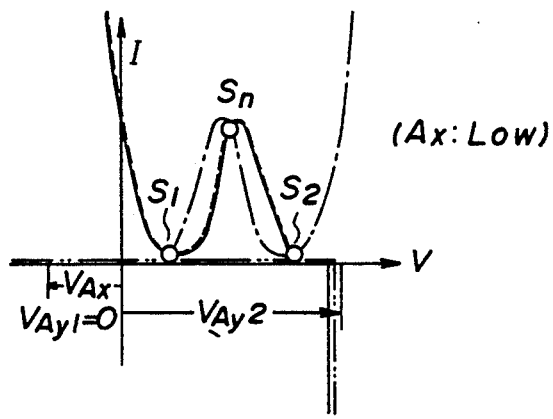
FIGS. 11(A)-11(C) are diagrams showing the operation of the memory cell transistor of FIG. 9 for reading out information.
Figure 11B:
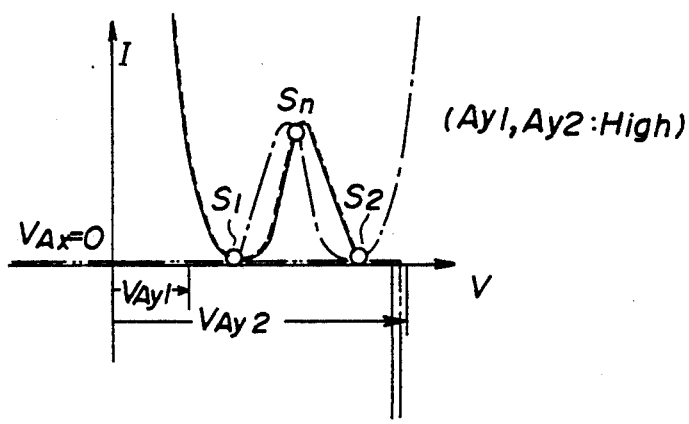
Figure 11C:
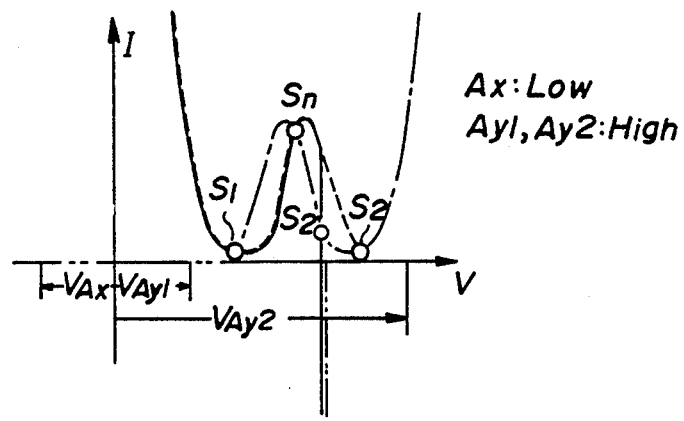

FIGS. 11(A)–11(C) shows the reading of data from the memory cell transistor MC by biasing the bit line Ax and the word lines $Ay_1$ and $Ay_2$.

Referring to FIG. 11(A) corresponding to the state of FIG. 10(A), the bit line voltage $V_{Ax}$ alone is set to a low level state. In the state of FIG. 11(A), the bistable operational characteristics of the memory cell transistor MC is retained. In the state of FIG. 11(B), on the other hand, both the first and second word line voltages $V_{Ay1}$ and $V_{Ay2}$ are biased to a high level state while maintaining the foregoing relationship between the voltages $V_{Ay1}$ and $V_{Ay2}$. In this case, too, the bistable characteristics of the memory cell transistor MC is unchanged.

FIG. 11(C), on the other hand, corresponds to the state of FIG. 10(B) for reading the content of the memory cell transistor MC. It will be noted that the reading of information can be achieved by biasing the bit line voltage $V_{Ax}$ to the low level state and simultaneously biasing the word line voltages $V_{Ay1}$ and $V_{Ay2}$ to the high level state. Thereby, the collector current flows through the bit line Ax and one can identify the content of data by detecting the collector current.

Figure 12A:
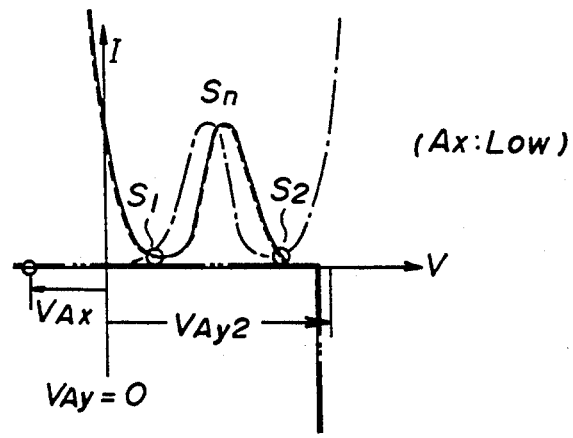
FIGS. 12(A)-12(C) are diagrams showing the other operation of the memory cell transistor of FIG. 9 for reading out information.
Figure 12B:
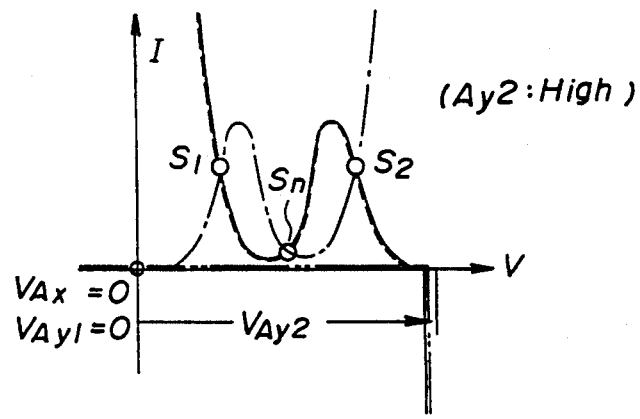
Figure 12C:
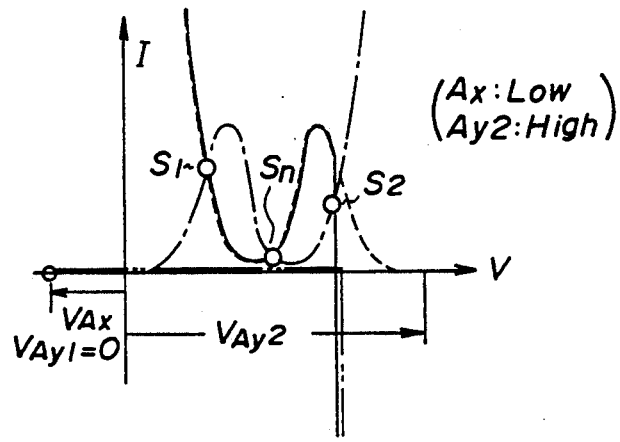

FIGS. 12(A)–12(C) show the reading operation corresponding to the second embodiment of FIG. 8, wherein FIG. 12(A) si substantially identical with FIG. 11(A) in correspondence to the biasing of the bit line Ax to the low level state. As the word line $Ay_1$ is grounded, there appears only the word line voltage $V_{Ay2}$. FIG. 12(B) in turn shows the state wherein the word line $Ay_2$ alone is biased to the high level state. In this state, too, the bistable characteristics of the memory cell transistor MC is retained. FIG. 12(C) shows, on the other hand, the state wherein the bit line Ax and the word line $Ay_2$ are biased simultaneously. Thereby, it will be noted that one can read the content of th information stored in the memory cell transistor MC by detecting the current that flows through the bit line Ax, similarly to FIG. 11(C).

Figure 13A:
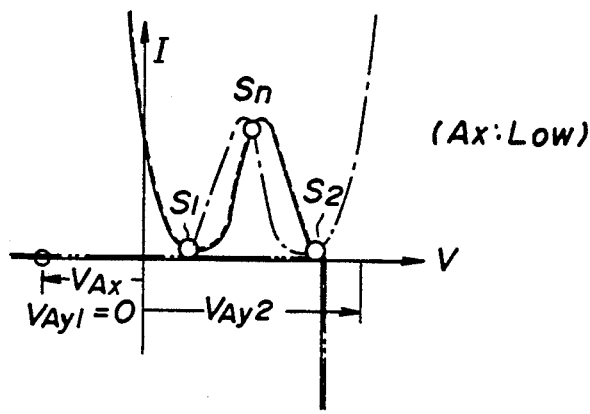
FIGS. 13(A)-13(C) are diagrams showing operation of the memory cell transistor of FIG. 9 for writing a first binary digit.
Figure 13B:
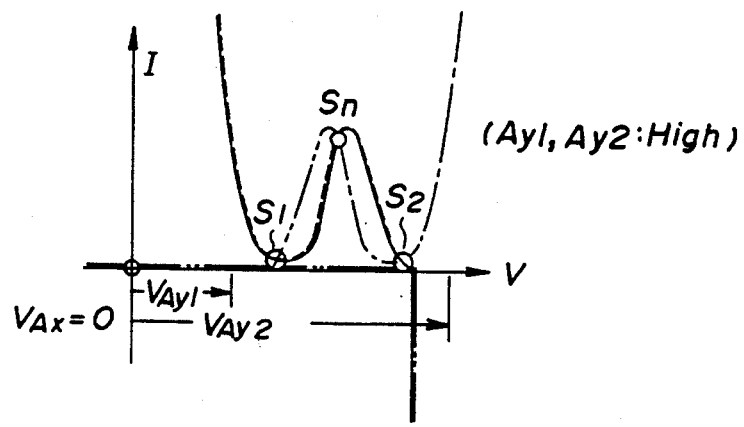
Figure 13C:
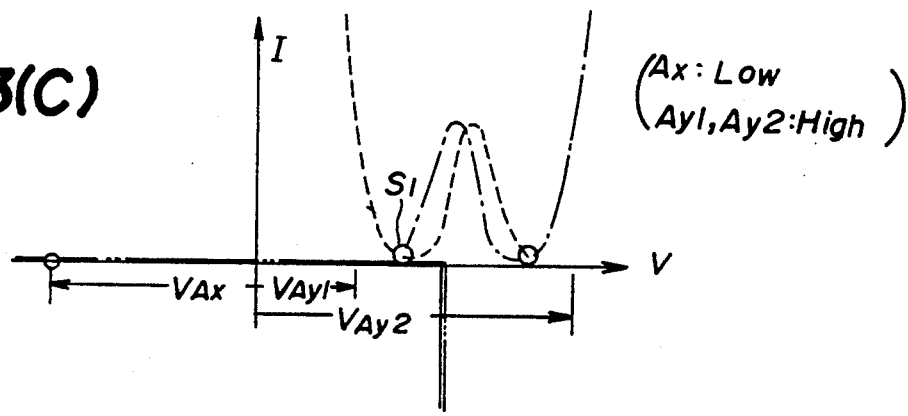

FIGS. 13(A)–13(C) show the writing of information in the form of the operational state $S_1$, wherein FIG. 13(A) corresponds to FIG. 11(A) and FIG 13(B) corresponds to FIG. 11(B). Thus, the description of FIGS. 13(A) and 13(B) will be omitted. FIG. 13(C), on the other hand, corresponds to FIG. 10(C) wherein the bit line voltage $V_{Ax}$ is biased negatively to an LL (Low-Low) state such that there exists only one operational point $S_1$. Thereby, the operational state of the memory cell transistor MC is forcedly set to the state $S_1$.

Figure 14A:
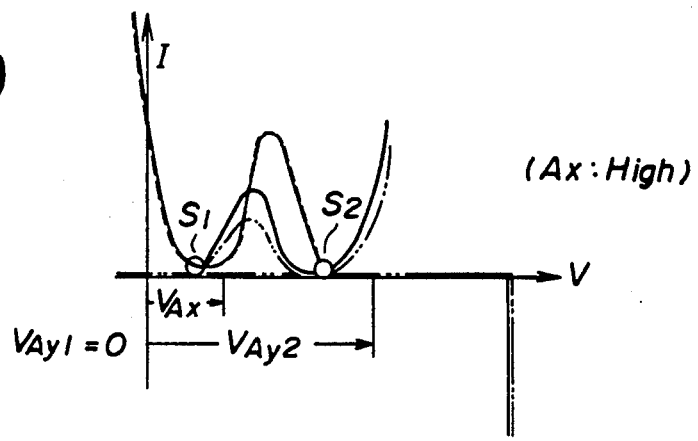
FIGS. 14(A)-14(C) are diagrams showing the operation of the memory cell transistor of FIG. 9 for writing a second, opposite binary digit.
Figure 14B:
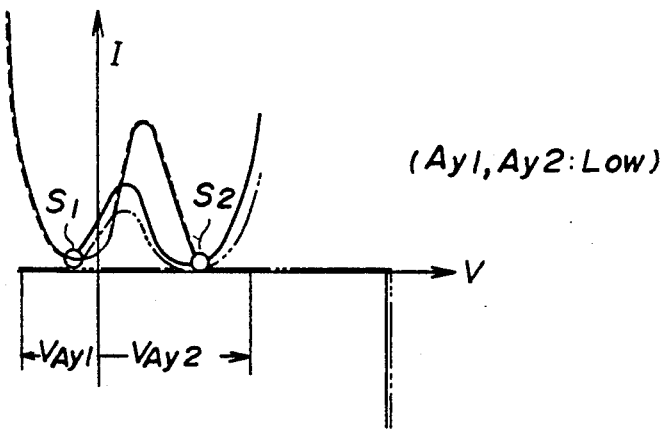
Figure 14C:
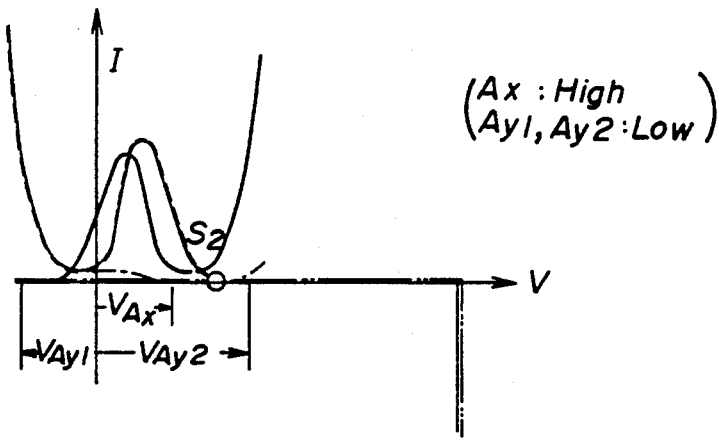

FIGS. 14(A)–14(C) show the writing of information in the form of the operational point $S_2$ in correspondence to FIGS. 10(D) and 10(E).

Referring to FIG. 14(A) first, the biasing state corresponds to the biasing state of FIG. 14(B), and the bit line voltage $V_{Ax}$ alone is set to the high level state. Thereby, the memory cell transistor MC is operated in the gain region. In the state of FIG. 14(A), it will be noted that the characteristic curve still includes the two operational points $S_1$ and $S_2$. FIG. 14(B), in turn, shows the biasing of the word lines $Ay_1$ and $Ay_2$ to the low level state. Again, there appears the bistable operational characteristics.

When the bit line Ax is biased to the high level state and the word lines $Ay_1$ and $Ay_2$ biased to the low level state, as shown in FIG. 14(C), the intersection of the base-emitter current $I_{B \to E1}$ and the base-emitter current $I_{E2 \to B}$ at the operational point $S_1$ disappears as already explained, and the memory cell transistor MC is forced to operate at the operational point $S_2$. Thereby, one can write the binary information into the memory cell transistor MC in correspondence to the operational state $S_2$.

Figure 15A:
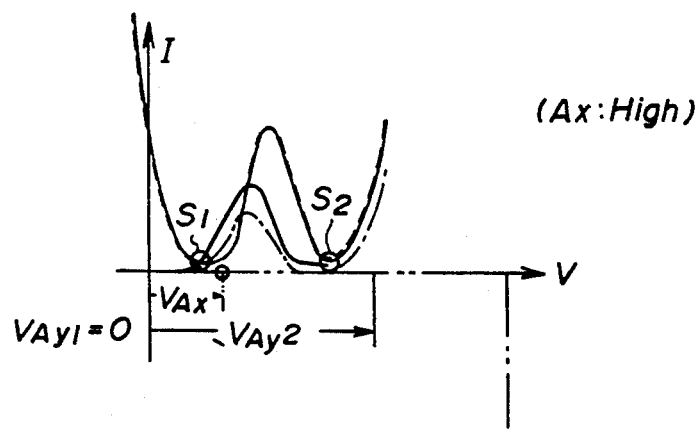
FIGS. 15(A)-15(C) are diagrams showing another operation of the memory cell transistor of FIG. 9 for writing the second binary digit.
Figure 15B:
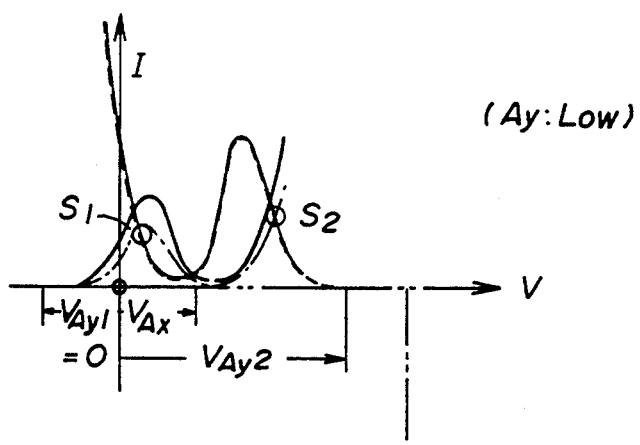
Figure 15C:
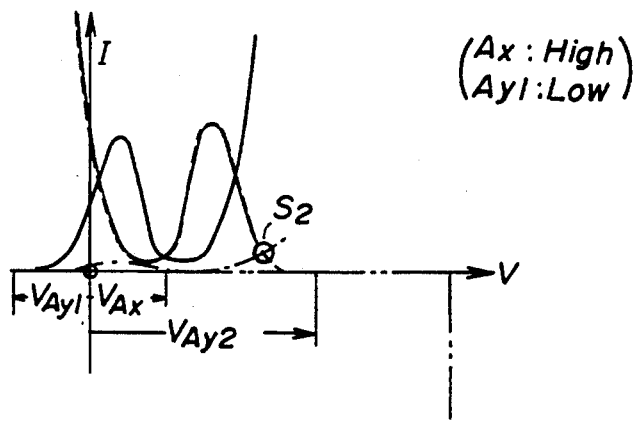

FIGS. 15(A)–15(C) are diagrams showing the writing of the information in correspondence to the operational state $S_2$ for ht case of the second embodiment of FIG. 8, wherein FIG. 15(A) shows the biasing state where the bit line Ax alone is biased to the high level state and FIG. 15(B) shows the state where the word line $Ay_1$ alone is biased to the low level state. In any of the states of FIGS. 15(A) and 15(B), it will be seen that the memory cell transistor MC retains the bistable operational characteristics.

In the state of FIG. 15(C), on the other hand, the increased gain of the memory cell transistor MC results in a decrease of the base-emitter current $I_{B \to E1}$ as represented by the one-dotted chain, and the operational point $S_1$ disappears. Thereby, the memory cell transistor MC is force to operate at the operational point $S_2$.

Hereinafter, the structural feature of the semiconductor memory device of ht present invention will be described with reference to FIG. 16.

Figure 16:
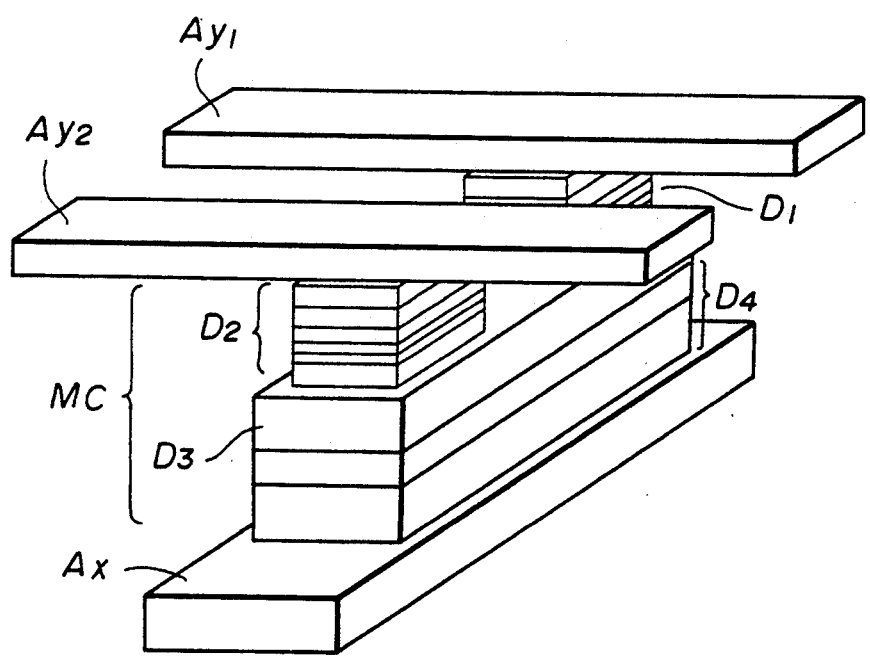
FIG. 16 is a diagram showing the structure of the memory cell transistor according to the first embodiment of the present invention.

Referring to FIG. 16, a part $D_4$ of the layered semiconductor body shown in FIG. 1 is provided on the conductor strip Ax in correspondence to the collector C, and a part $D_3$ corresponding to the base B is provided on the part $D_4$. Further, the two layered parts $D_1$ and $D_2$ also shown in FIG. 16, are provided on a common upper major surface of the part $D_3$, respectively in correspondence to the intersection between the conductor strip Ax and the conductor strip $Ay_1$ and in correspondence to the intersection between the conductor strip Ax and the conductor strip $Ay_2$. There, the layered parts D1 and D2 include respectively the emitter $E_1$ and the emitter $E_2$, while the layered part $D_3$ includes the collector of the RHET. Further, the part D4 includes the collector of the RHET as already noted.

In the structure of FIG. 16, it should be noted that the memory cell transistor is formed simply in correspondence to the intersection of the bit line Ax and the word liens $Ay_1$ and $Ay_2$, with no extraneous structures, contrary to the conventional static random access memories that require at least six transistors for forming the flip-flop circuit.

Figure 17:
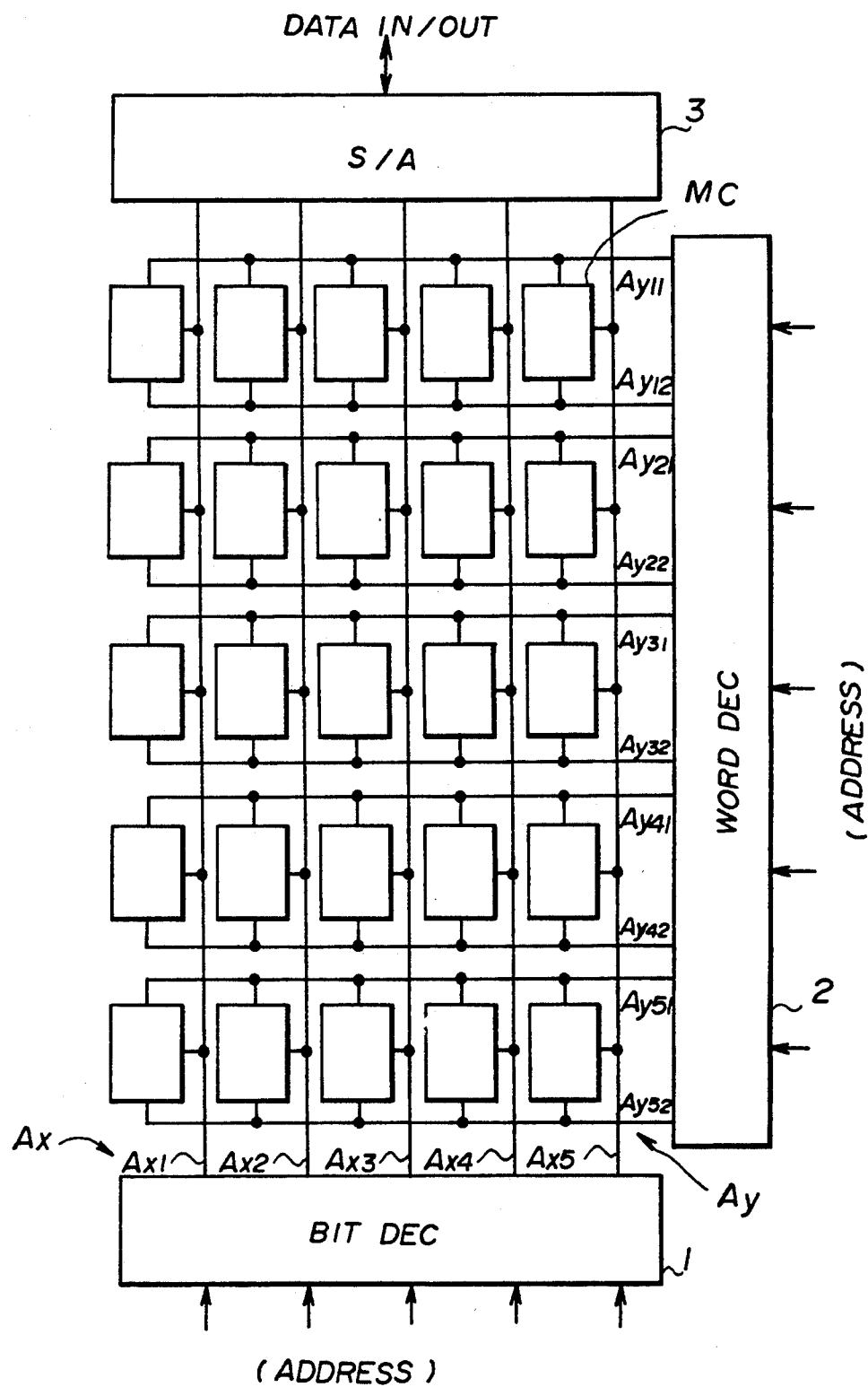
FIG. 17 is a diagram showing the overall construction of an SRAM that uses the memory cell transistor of FIG. 7.

FIG. 17 is a block diagram showing the overall construction of a static random access memory that is constructed by arranging the memory cell transistor MC of FIG. 16 in rows and columns.

Referring to FIG. 17, the memory cell transistors MC are arranged in rows and columns and there are provided a number of word line pairs $Ay_{11}$ and $Ay_{12}$, $Ay_{21}$ and $Ay_{22}$, $Ay_{31}$ and $Ay_{32}$, . . . to extend in the lateral direction. Further, there are provided a number of bit lines Ax extending in the vertical or column direction in the illustration, wherein each word line pair such as $Ay_{11}$ and $Ay_{12}$ are connected to a memory cell MC that in turn is connected to a bit line Ax as shown in FIG. 16. Further, each word line is connected to a word decoder 2 that is supplied with the row address data, while each bit line is connected to a bit decoder 1 that is supplied with the column address data. Further, each bit line Ax is connected to a sense amplifier 3 for data reading and data writing.

It should be noted that the content of the information stored in the memory cell transistor MC can be determined by detecting the current flowing through the bit line, such as the bit line, Ax as already described, wherein the sense amplifier 3 is used to detect the current in the bit line Ax. When writing data, on the other hand, the word line voltage is boosted simultaneously to the bit line voltages, and the writing of data is achieved according to the principle described previously.

Figure 18:
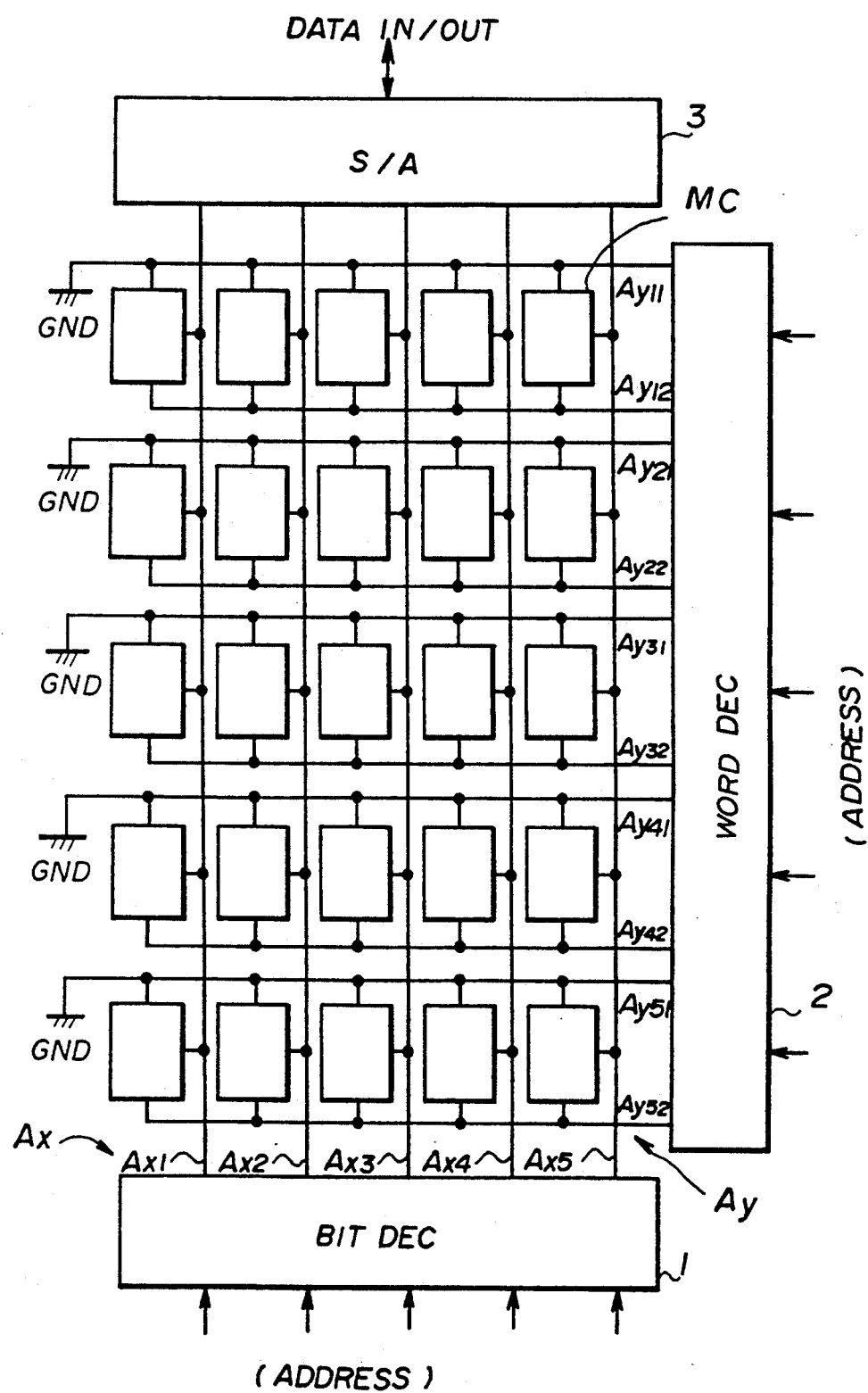
FIG. 18 is a diagram showing the overall construction of another SRAM that uses the memory cell transistor of FIG. 8.

FIG. 18 is another block diagram showing the overall construction of the static random access memory that is constructed based upon the memory cell of FIG. 8. There, the circuit is substantially identical to FIG. 17 except that one of the word lines in each word line pairs is connected to th ground.

Figure 19:
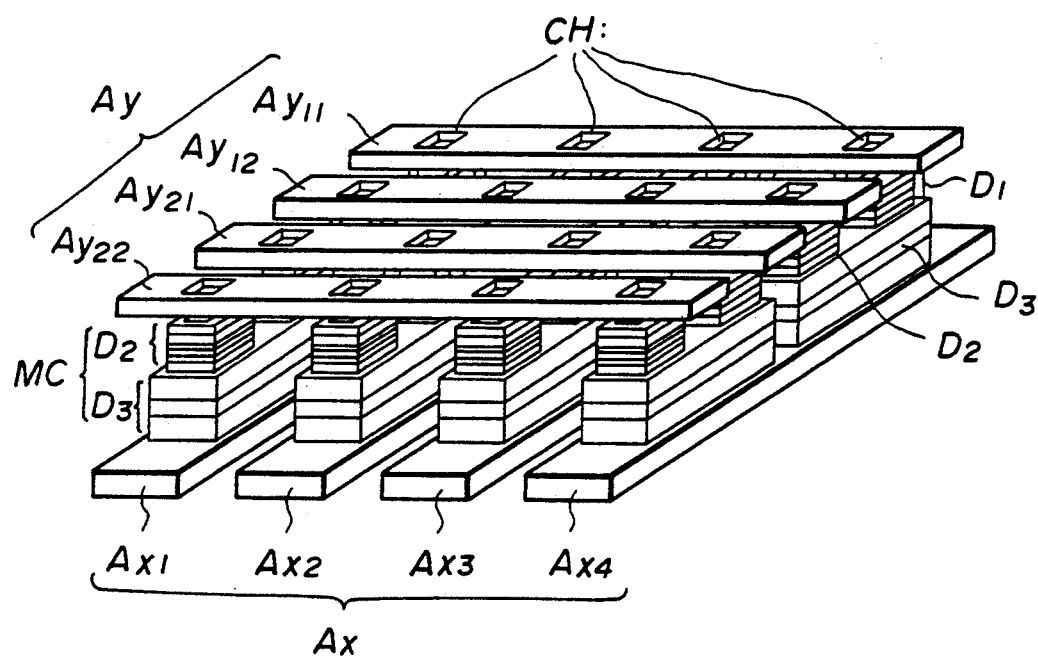
FIG. 19 is a diagram showing the construction of the SRAM of FIG. 17 in a perspective view.

FIG. 19 shows the static random access memory of FIG. 17 in a perspective view, wherein it will be noted that th bit lines $Ax_1$, $Ax_2$, ... are arranged parallel on a support substrate (not illustrated) to extend parallel with each other, and the word line pairs $Ay_{11}$ and $Ay_{12}$, $Ay_{22}$ and $Ay_{21}$, ... are disposed above the bit lines with a separation therefrom. Further, in correspondence to the intersections between the word liens and the bit liens, the memory cell transistors MC are formed to extend from the upper major surface of the conductor strip forming the bit line to the lower major surface of the conductor strip that forms the word line. Further, in correspondence to where the memory cell transistor MC contacts to the corresponding word line, there if provided a contact hole CH for ensuring the ohmic contact between the conductor strip forming the bit lien and the uppermost semiconductor layer of the memory cell transistor MC.

Figure 20:
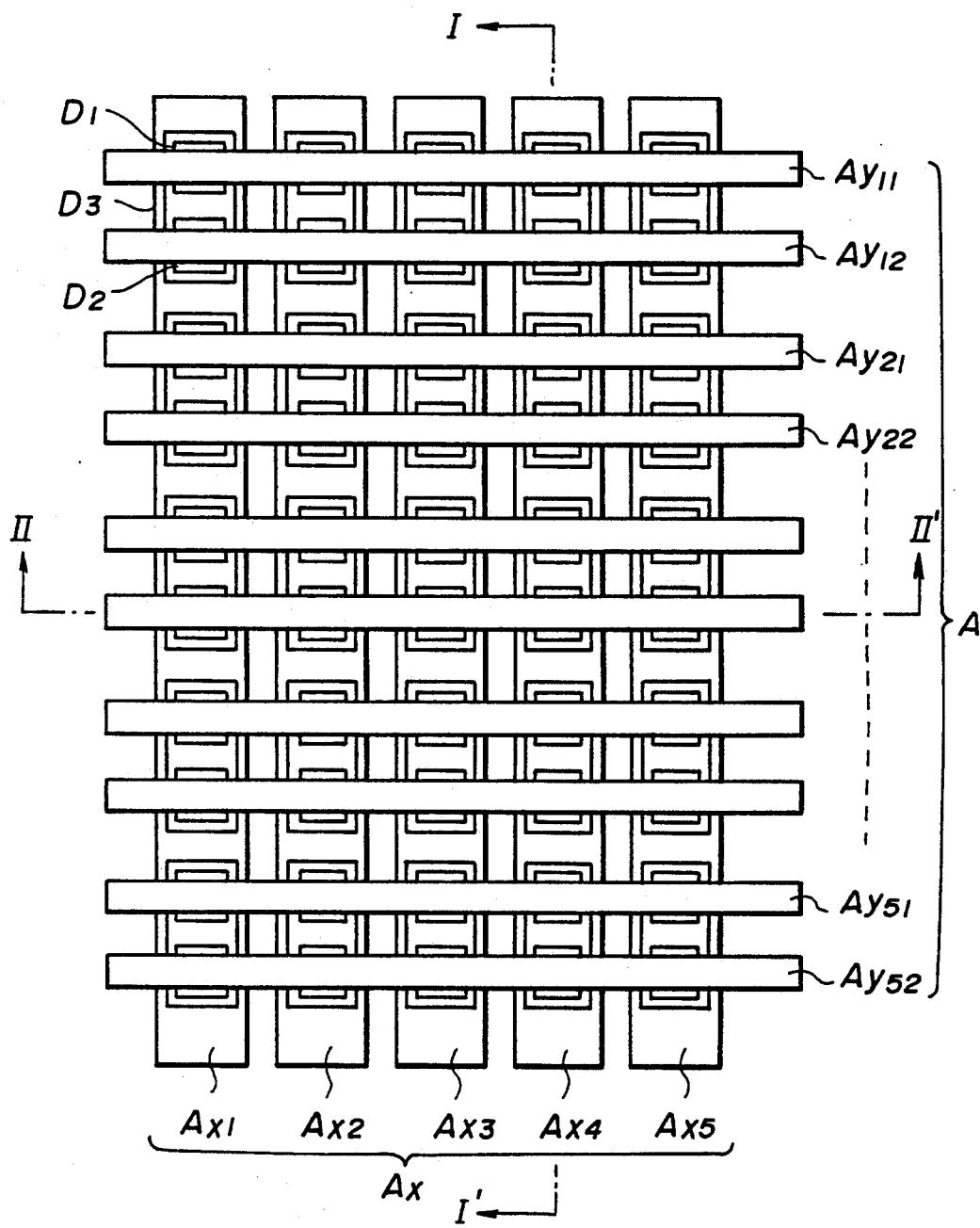
FIG. 20 is a diagram showing the construction of the SRAM of FIG. 17 in a plan view.

FIG. 20 is a plan view of the structure of FIG. 19. As will be noted, the word lines $Ax_1$–$Ax_5$ and the bit liens $Ay_{11}$–$Ay_{52}$ form a criss-cross pattern, with the memory cell transistor MC formed in correspondence to the intersection of the criss-cross pattern. Thereby, the memory cell transistor MC of the present invention occupies only the space for the conductor strips forming the word lines and the bit lines. No other elements exist in the arrangement of the memory device of FIG. 20. Thus, the present invention is extremely advantageous for increasing the integration density and hence the storage capacity of the semiconductor memory devices. As the memory device of the present invention holds the information as a result of the bistable operation of the RHET, the memory does not require refreshing and operates as a fast-speed static random access memory. Thus, the semiconductor memory device of the present invention is extremely useful for a high speed, large-capacity memory of computers and other various microprocessors.

Figure 22:
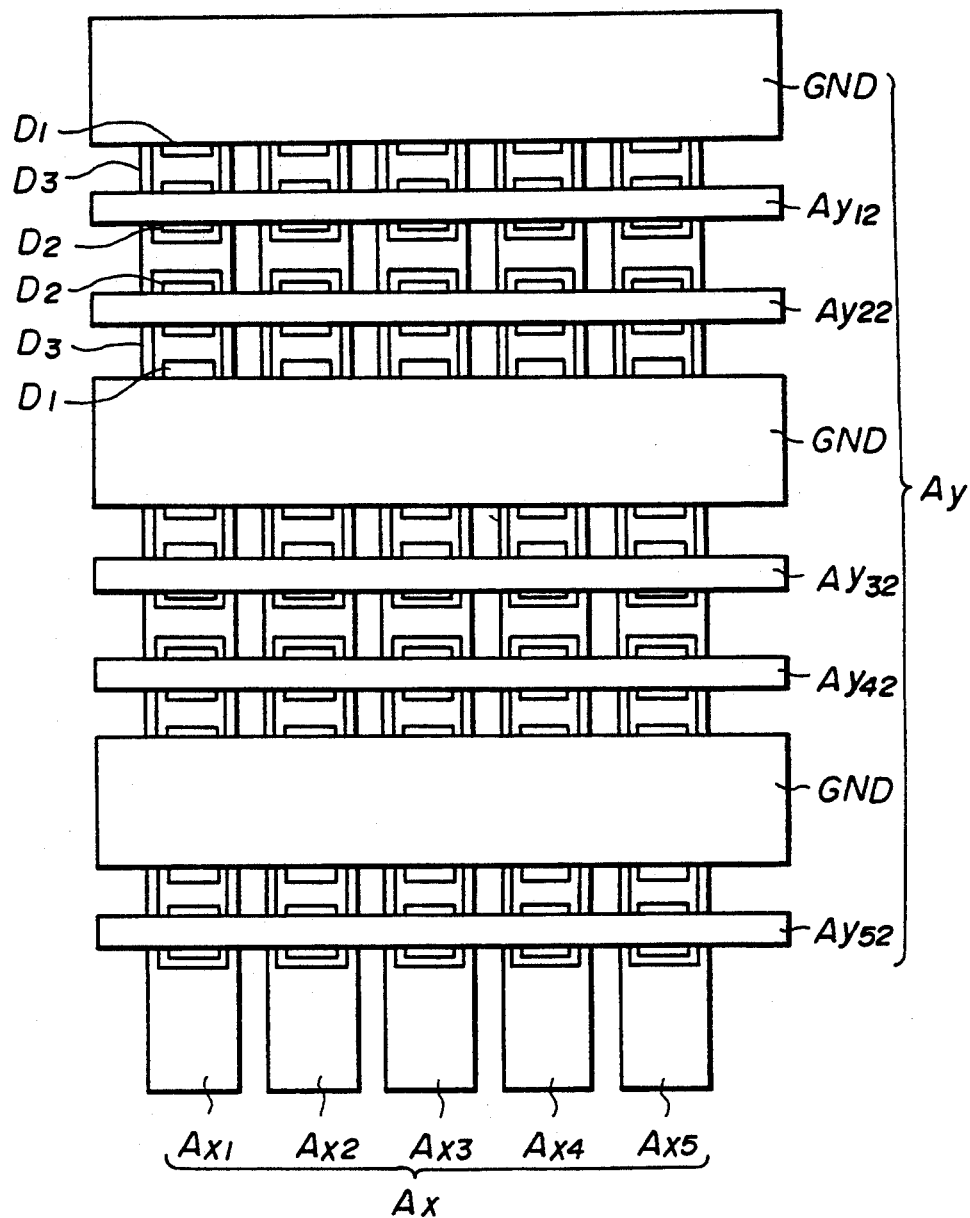
FIG. 22 is a diagram showing the construction of the SRAM of FIG. 18 in a plan view.
Figure 21:
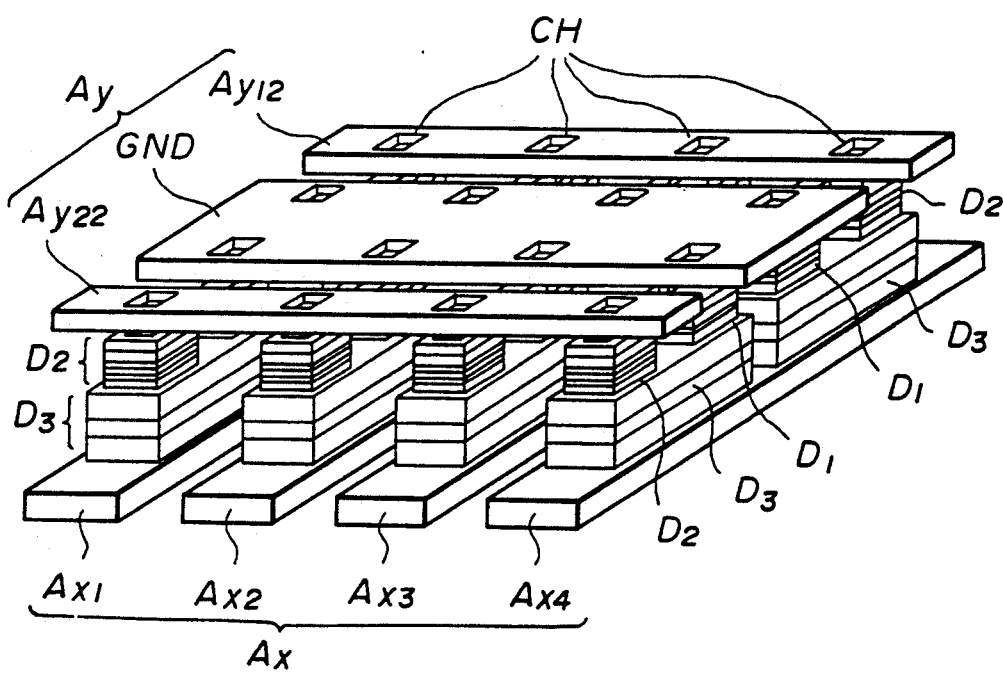
FIG. 21 is a diagram showing the construction of the SRAM of FIG. 18 in a perspective view.

FIGS. 21 and 22 show the static random access memory of FIG. 18 in the perspective view.

In the present embodiment, the adjacent conductor strips $Ay_{12}$ and $Ay_{21}$ of FIG. 19 are formed of a single conductor band that is connected to the ground. Thereby, the semiconductor memory device of FIG. 21 uses the memory cell transistor of FIG. 8. As the rest of the feature of the present embodiment is obvious, further description will be omitted.

Next, the fabrication process of the structure of FIG. 19 will be described with reference to FIGS. 2(A)–23(J), wherein the illustration at the left shows the cross section taken along the line I—I' of FIG. 20, while the illustration at the right shows the cross section taken along the line II—II'.

Referring to FIG. 23(A), th layered body 100 shown in FIG. 1 is provided on a conductive layer 150 that in turn covers a support substrate not illustrated by means of a bonding process, and an array of square or rectangular mask patterns 101 are formed on the upper major surface of the layered body 100 by a photolithographic patterning of a photoresist, such that each rectangular pattern 101 corresponds to the regions $D_1$ and $D_2$ to be formed. Next, while using the resist pattern thus formed as a mask, the layered body 100 is etched until the layer 15 is exposed as shown in FIG. 23(B). Thereby, the layered structures $D_1$ and $D_2$ are formed in correspondence to the first emitter $E_1$ and the second emitter $E_2$. In the description hereinafter, the semi-insulating GaAs layer 11 is included in the layered body 100.

Further, in the step of FIG. 23(C), the structures D1 and D2 thus formed are protected by a resist mask 102 that is formed in correspondence to the collector structure D3 of the RHET. See FIG. 1. Next, while using the resist 102 as a mask, the layers 14–11 are etched until the conductor layer 150 is exposed as shown in FIG. 23(D), and the basic structure of the memory cell transistor MC is formed.

After the structure of FIG. 23(D) is formed as such, a resist pattern 103 is formed to extend in the I—I' direction, such that the surface of the conductor layer 150 is exposed selectively in correspondence to the part located between adjacent memory cell transistors MC as shown in the right drawing of FIG. 23(E). Further, while using the resist pattern 103 as a mask, the conductor layer 150 is etched in the step of FIG. 23(F) to form the parallel conductor strips Ax.

Next, in the step of FIG. 23(G), the memory cell transistor MC is embedded in a resist 105 and a second resist 106 is provided on the resist 105. Further, the resists 105 and 106 are patterned in the step of FIG. 23(H) to form a groove in the upper resist layer 106 in correspondence to the word line conductor patterns $Ay_1$ and $Ay_2$ to be formed. It should be noted that ht lower resist layer 105, too, is patterned to expose the upper major surface of the layered body parts $D_1$ and $D_2$. As already noted, the part $D_1$ corresponds to the emitter $E_1$, while the part $D_2$ corresponds to the emitter $E_2$. Further, in the step of FIG. 23(I), a conductor layer 107 is deposited, and the remaining resist is removed subsequently in the lift-off process to form the structure of FIG. 23(J). Thereby, it will be noted that the conductor layer 107 is patterned to form an air bridge structure in correspondence to the parallel word line patterns $Ay_1$ and $Ay_2$.

FIGS. 24(A)-24(K) show another fabrication process of the static random access memory of the present invention,.

Figure 24A:
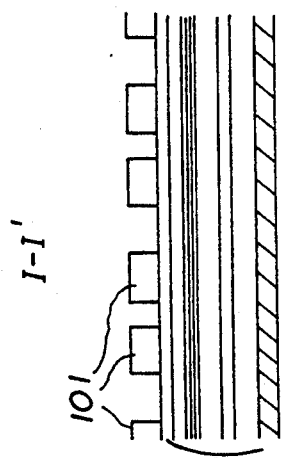
Figure 24B:
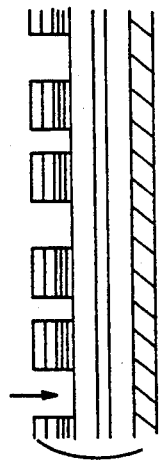
Figure 24C:
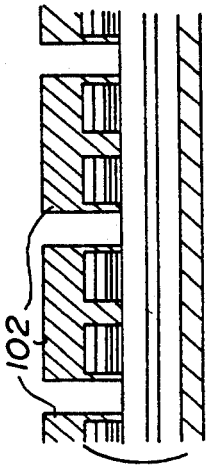
Figure 24D:
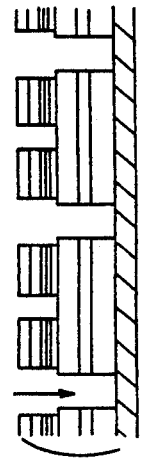
Figure 24E:
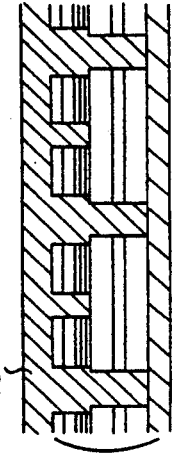

Referring to the drawings, the steps in FIGS. 24(A)-24(F) are substantially identical with the steps in FIGS. 24(A)-24(F), an in the step of FIG. 24(G), a polyimide layer 110 is applied to bury the structure of FIG. 24(F) underneath.

Next, in the step of FIG. 24(H), the polyimide layer 110 is removed partially in correspondence to the top part thereof to expose the top part of the structure formed in the step of FIG. 24(F). Further a resist layer is applied in the step of FIG. 24(I) and patterned subsequently to form grooves that extend parallel in the II-—II' direction in correspondence to the bit lie patterns $Ay_1$ and $Ay_2$ to be formed.

Further, a conductor layer 112 is deposited on the structure of FIG. 24(I) in the step of FIG. 24(J), and the resist pattern 111 is lifted off in the step of FIG. 24(K) to form the desired memory structure.

Next, another fabrication process of the static random access memory of the present invention will be described with reference to FIGS. 24(A)–24(R), wherein the use of the resist mask is minimized for increasing the integration density.

Referring to FIG. 25(A), a metal layer 201 is deposited on the layered body 100 that is bonded to a substrate not illustrated via the conductor layer 150. Further, in the step of FIG. 25(B), an insulator layer 202 such as silicon oxide is deposited on the layer 201 and the layer 202 is subjected to a patterning process by providing a resist pattern 203 in the step of FIG. 25(C). In the illustration at the left of FIG. 25(C), those resist patterns 203 that are separated from each other by the gap A correspond to the first and second layered parts $D_1$ and $D_2$ that are formed on the same memory cell transistor, while those resist patterns that are separated by a gap B corresponds to the layered part forming different memory cell transistors. In the cross section taken along the II—II' direction, the resist patterns are separated from each other uniformly by a distance C.

Next, in the step of FIG. 25(D), the insulator layer 202 is patterned while using the resist pattern 203 as a mask, and the metal layer 201 is patterned subsequently while using the patterned insulator layer 202 as a mask as shown in FIG. 25(E).

Next, in the step of FIG. 25(F), the layered body 100 is patterned while using the layer 202 as a mask until the layer 15 is exposed, and the structure thus obtained is covered by an insulation film 204 in the step of FIG. 25(G) such that the gap B is filled by the insulation film 204 while the gap A still remains. Typically, the deposition of the film 204 is made by depositing silicon oxide by a CVD process.

In the step FIG. 25(H), the layer 204 covering the bottom of the groove formed in correspondence to the gap A is subjected to an anisotropic etching process to expose the surface of the layer 15. Such an anisotropic etching process of FIG. 25(H) also exposes the silicon oxide layer 202 that covers the top part of the layered parts $D_1$ and $D_2$. Sill, it will be noted that the top surface as well as the side walls of the parts $D_1$ and $D_2$ are covered by the silicon oxide film after the step of FIG. 25(H). In FIG. 25(H), the silicon oxide films that cover the parts $D_1$ and $D_2$ are designated collectively as 202.

Next, in the step of FIG. 25(I), another anisotropic etching process is applied against the exposed surface of the layered semiconductor body 100 to proceed vertically while using ht silicon oxide film 202 as a mask, until the conductor layer 150 is exposed, such that the individual memory cell transistors MC are separated from each other by a groove. Next, the groove thus formed as a result of the anisotropic etching process of FIG. 25(J) is filled by an insulator layer 205 such as silicon oxide, wherein the grooves separating the memory cell transistors in the I—I' cross section are completely filled by the insulator layer 205, while the insulator layer 205 covers only the bottom part of the groove in the cross section taken along the II—II' direction.

Next, the insulator layer 205 of FIG. 25(J) is subject to an anisotropic etching process that proceeds vertically such that the layer 205 covering the bottom part of ht groove in the II—II' cross section of FIG. 25(J) is removed in the step of FIG. 25(K). Thereby, the conductor layer 150 is exposed. Further, while using the insulator layer 205 thus patterned as a mask, the conductor layer 150 is subjected to an etching process int eh step of FIG. 25(L) such that the conductor layer 150 is patterned into a number of bit line strips Ax.

After the step of FIG. 25(L), an insulator layer 206 is deposited to fill the groove that separates the memory cell transistors MC from each other in the cross section of II—II' direction in the step of FIG. 25(M) such that the semiconductor structure is embedded in an insulating layer that includes the insulator layer 202 and the insulator layer 206. For the sake of simplicity, the insulating layers 202 and 206 are collectively designated as 202.

Figures 25P, 25Q, 25R:
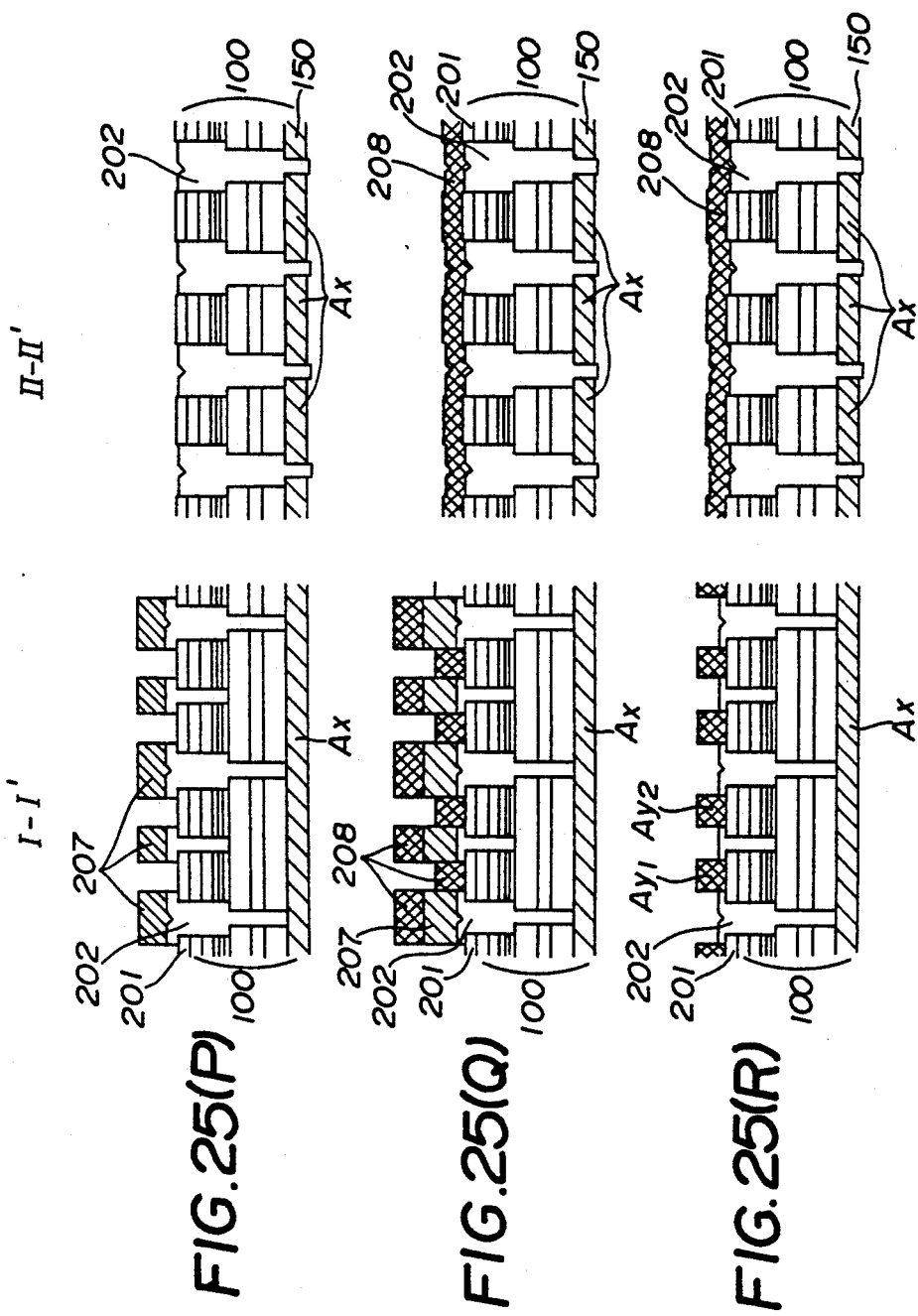

Further, the top part of the insulating layer 202 of FIG. 25(M) is removed by an anisotropic etching process in the step of FIG. 25(N), and resist patterns 207 are formed on the top part of the insulating material that covers the semiconductor structure in the step of FIG. 25(O) in correspondence to the word conductor patterns $Ay_1$ and $Ay_2$ to be formed. Further, while using the resist pattern 207 as a mask, the insulating layer 202 is patterned in the step of FIG. 25(P) to expose the top surface of the layered body parts $D_1$ and $D_2$, and a conductor layer 208 is deposited on the structure of FIG. 25(P) in the step of FIG. 25(Q). After removing the resist 202, one obtains the structure of FIG. 25(R) wherein the word line strips $Ay_1$ and $Ay_2$ are formed in correspondence to the top part of the structure.

As the present fabrication process employs the resist pattern only once in correspondence to the step of FIGS. 25(C) and 25(D), and that the rest of the patterning processes proceed in the self-alignment manner, the error of fabrication is minimized. In other words, one can maximize the integration density of the static random access memory.

Further, the present invention is not limited to the embodiments described heretofore, but various variations and modifications may be made without departing from the scope of the invention.

What is claimed is:

1. A semiconductor memory device, comprising:
   a first conductor strip extending in a first direction and acting as a bit line, said first conductor strip having an upper major surface;
   a second conductor strip extending in a second direction different from said first direction and acting as a first word line, said second conductor strip having a lower major surface and provided above said first conductor strip with a separation therefrom;
   a third conductor strip extending also in said second direction and located adjacent to said second conductor strip, said third conductor strip acting as a second word line, said third conductor strip having a lower major surface and provided above said first conductor strip with a separation therefrom; and
   a transistor provided in correspondence to a first intersection which occurs where said first conductor strip and said second conductor strip cross with each other when viewed in a direction perpendicular to said upper major surface of said first conductor strip and further in correspondence to a second intersection which occurs where said first conductor strip and said third conductor strip cross with each other when viewed in a direction perpendicular to said upper major surface of said first conductor strip;
   said transistor exhibiting a negative differential resistance an comprising:
   a collector layer provided on said upper major surface of said first conductor strip and extending continuously along said first conductor strip from said first intersection to said second intersection, said collector layer comprising a doped semiconductor layer for collecting carriers and a collector barrier layer provided on said doped semiconductor layer for forming a potential barrier in said collector layer;

a base layer of a doped semiconductor material provided on an upper major surface of said collector layer and extending continuously form said first intersection to said second intersection, said base layer allowing a transit of carriers therethrough;

a first emitter layer provided on a portion of said base layer corresponding to said first intersection such that said first emitter layer has an upper major surface in contact with said lower major surface of said second conductor strip, said first emitter layer comprising a first resonant structure including a quantum well layer and a pair of tunneling barrier layers sandwiching the quantum well layer therebetween, for realizing a first negative differential resistance characteristic corresponding to said negative differential resistance and a doped semiconductor layer provided on said first resonant structure for injecting carriers into said base layer via said first resonant structure; and a second emitter layer provided on a portion of said base layer corresponding to said second intersection such that said second emitter layer has an upper major surface in contact with said lower major surface of said third conductor strip, said second emitter layer comprising a second resonant structure including a quantum well layer and a pair of tunneling barrier layers sandwiching the quantum well layer therebetween, for realizing a second negative differential resistance characteristic corresponding to said negative differential resistance and a doped semiconductor material provided on said second resonant structure for injecting carriers into said base layer via said second resonant structure.

2. A semiconductor memory device as claimed in claim 1, wherein said first conductor strip is repeated a plurality of times in said second direction to form a plurality of bit lines, said second conductor strip and said third conductor strip forming a word line pair that is repeated a plurality of times in said first direction, and wherein said semiconductor memory device includes said transistor provided in plurality of numbers in correspondence to each intersection between said first conductor strip and said word line pair.

3. A semiconductor memory device as claimed in claim 1, wherein said second and third conductor strips form an air-bridge structure with respect to said first conductor strip.

4. A semiconductor memory device as claimed in claim 1, wherein said transistor is embedded in an insulator layer, and said second and third conductor strips are provided on an upper major surface of said insulator layer.

5. A semiconductor memory device as claimed in claim 1, wherein said transistor forms a resonant-tunneling hot electron transistor.

6. A semiconductor memory device as claimed in claim 1, wherein said third conductor strip is grounded.

7. A semiconductor memory device, comprising:

a memory cell transistor having a collector, a base provided on said collector, a first emitter provided on said base, and a second emitter provided on said base, said base being common to said first emitter and second emitter with an electrical separation therefrom, said memory cell transistor injecting carriers from said first and second emitters into said collector via said base and showing a negative differential resistance between said collector and said first emitter and between said collector and said second emitter;

a bit line connected to said collector for carrying a bit line selection signal;

a first word line connected to said first emitter for carrying a first word line selection signal;

a second word line connected to said second emitter for carrying a second word line selection signal;

bit line selection means for supplying said bit line selection signal; and word line selection means for supplying said first and second word line selection signals such that said first word line selection signal is biased to a voltage level that is higher than said second word line selection signal.

8. A semiconductor memory device as claimed in claim 7, wherein said bit line selecting means and said word line selection means set the voltage level $V_{Ax}$ of said bit line selection signal and the voltage levels $V_{Ay1}$ and $V_{Ay2}$ of said first and second word line selection signals such that said memory cell transistor shows a bistable operation for use in holding data, wherein a first voltage level $V_{A1}$ represents the voltage of a first stable operational point S1 and a second voltage level $V_{S2}$ represents the voltage of a second stable operational point S2, said second voltage level $V_{S2}$ being larger than said first voltage level $V_{S1}$ ($V_{S2} > V_{S1}$), with an unstable operational point Sn interposed therebetween at a voltage level $V_{Sn}$.

9. A semiconductor memory device as claimed in claim 8, wherein, when reading formation, said bit line selection means sets the voltage level $V_{Ax}$ of said bit line selection signal to satisfy a relationship $$V_{Sn} < V_{Ax} + V_{th} < V_{S2},$$

where $V_{th}$ represents a threshold voltage of the junction between said collector and said base, and said word line selection means set the voltage level $V_{Ay1}$, $V_{Ay2}$ of said first and second word line selection signals to respective high level states.

10. A semiconductor memory device as claimed in claim 8, wherein, when writing information in correspondence to a first bistable operational point at the voltage level $V_{S1}$, said bit line selection means sets the voltage $V_{Ax}$ of the bit line selection signal to a low level state such that a condition $V_{Ax} + V_{th} < V_{Sn}$ is satisfied, where $V_{th}$ represents a threshold voltage of the junction between said collector and said base and said word line selection means set the voltage levels $V_{Ay1}$ and $V_{Ay2}$ of said first and second word line selection signals to respective high level states.

11. A semiconductor memory device as claimed in claim 8, wherein, when writing information in correspondence to a second bistable operational point at the voltage level $V_{S2}$, said bit line selection means sets the voltage $V_{Ax}$ of said bit line selection signal such that said bistable operational point at the voltage level $V_{S1}$ disappears, and said word line selection means set the voltage levels $V_{Ay1}$ and $V_{Ay2}$ of the first and second word line selection signals to respective high level states.

* * * * *

UNITED STATES PATENT AND TRADEMARK OFFICE
CERTIFICATE OF CORRECTION

PATENT NO. : 5,311,465
DATED : May 10, 1994
INVENTOR(S) : Toshihiko Mori, et al

Page 1 of 3

It is certified that error appears in the above-indentified patent and that said Letters Patent is hereby corrected as shown below:

Col. 5, line 13, delete "$E_1$" and insert therefor --$E_i$--;
Line 44, after "$V_{BC}$", insert a period (".").
Col. 6, line 25, delete "10";
Line 35, delete "$I_B\rightarrow$" and insert therefor --$I_{B\_}>$--;
Line 38, delete "$E2\rightarrow$" and insert therefor --$E2->$--.
Col. 7, line 13, after --$Ay_2$--, insert a comma (",");
Line 60, delete "$E2\rightarrow$" and insert therefor --$E2->$--;
Line 60, delete "$C\rightarrow$" and insert therefor --$C->$--.
Line 62, delete "$I_B\rightarrow$" and insert therefor ---$I_{B\_}>$--.
Line 67, delete "$I_{E2}\rightarrow$" and insert therefor ---$I_{E2\_}>$--.
Line 68, delete "$I_C\rightarrow$" and insert therefor ---$I_{C\_}>$--.
Col. 8, line 3, delete "$I_{E2}\rightarrow_B+T_C\rightarrow=I_B\rightarrow E1$" and insert therefor "$I_{E2\_}>_B+T_{C\_}>=I_{B\_}>E1$";
Line 62, delete "$I_B=$" and insert therefor --$I_{B\_}>$--;
Line 63, delete "$I_{E2}\rightarrow_B+I_C\rightarrow B$" and insert therefor
    --$I_{E2\_}>_B+I_{C\_}>B$--;
Line 64, delete "$I_{E2}\rightarrow$" and insert therefor --$I_{E2\_}>$--;
Line 66, delete "$I_C\rightarrow$" and insert therefor --$I_{C\_}>$--;
Line 66, delete "int he" and insert therefor --in the--.
Col. 9, line 1, delete "$I_B\rightarrow$" and insert therefor --$I_{B\_}>$--;
Line 1, delete "$I_{E2}\rightarrow$" and insert therefor --$I_{E2\_}>$--;
Line 29, delete "si" and insert therefor --is--;
Line 39, delete "th" and insert therefor --the--.
Col. 10, line 1, delete "$I_B\rightarrow$" and insert therefor --$I_{B\_}>$--;
Line 2, delete "$I_{E2}\rightarrow$" and insert therefor --$I_{E2\_}>$--;
Line 9, delete "ht" and insert therefor --the--;
Line 19, delete "$I_B\rightarrow$" and insert therefor --$I_{B\_}>$--;
Line 24, delete "ht" and insert therefor --the--.

UNITED STATES PATENT AND TRADEMARK OFFICE
CERTIFICATE OF CORRECTION

PATENT NO. : 5,311,465
DATED : May 10, 1994
INVENTOR(S) : Toshihiko Mori et al.

Page 2 of 3

It is certified that error appears in the above-indentified patent and that said Letters Patent is hereby corrected as shown below:

```
Col. 11, line 16, delete "th" and insert therefor --the--;
     Line 22, delete "liens" and insert therefor --lines--;
     Line 27, delete "if" and insert therefor --is--;
     Line 29, delete "lien" and insert therefor --line--;
     Line 33, delete "liens" and insert therefor --lines--;
     Line 62, delete the parentheses (")"), first occurrence.
Col. 12, line 23, after "I-I'", insert --direction with a
separation from each other in the II-II'--;
     Line 37, delete "ht" and insert therefor --the--;
     Lines 52 and 53, delete "24(A- )" and insert therefor
          --24(A)--;
     Line 63, delete "lie" and insert therefor --line--.
Col. 13, line 36, delete "In" and insert therefor --Next, in--;
     Line 42, delete "Sill" and insert therefor --Still--;
     Line 50, delete "ht" and insert therefor --the--;
     Line 64, delete "ht" and insert therefor --the--;
     Line 68, delete "int" and insert therefor --in--.
Col. 14, line 1, delete "eh" and insert therefor --the--.
Col. 15, line 10, delete "form" and insert therefor --from--.
Col. 16, line 28, delete "$V_{AI}$" and insert therefor --$V_{SI}$--;
```

UNITED STATES PATENT AND TRADEMARK OFFICE
CERTIFICATE OF CORRECTION

PATENT NO. : 5,311,465
DATED : May 10, 1994
INVENTOR(S) : Toshihiko Mori, et al

It is certified that error appears in the above-indentified patent and that said Letters Patent is hereby corrected as shown below:

Col. 16, line 62, after "voltage", insert --level--.

Signed and Sealed this

Eighth Day of November, 1994

Attest:

BRUCE LEHMAN

Attesting Officer     Commissioner of Patents and Trademarks